United States Patent
Nishijima

(10) Patent No.: US 9,490,208 B2
(45) Date of Patent: Nov. 8, 2016

(54) SEMICONDUCTOR DEVICE

(71) Applicant: Panasonic Intellectual Property Management Co., Ltd., Osaka (JP)

(72) Inventor: Masaaki Nishijima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/702,061

(22) Filed: May 1, 2015

(65) Prior Publication Data
US 2015/0235941 A1    Aug. 20, 2015

Related U.S. Application Data

(63) Continuation of application No. PCT/JP2013/004094, filed on Jul. 2, 2013.

(30) Foreign Application Priority Data

Nov. 9, 2012  (JP) .................. 2012-247095

(51) Int. Cl.
*H03H 7/38* (2006.01)
*H01L 23/528* (2006.01)
(Continued)

(52) U.S. Cl.
CPC ......... *H01L 23/528* (2013.01); *H01L 27/0629* (2013.01); *H01L 28/60* (2013.01);
(Continued)

(58) Field of Classification Search
CPC . H01L 23/528; H01L 27/0629; H01L 28/60; H01L 29/2003; H01L 29/7787; H01L 29/861; H03K 3/01
USPC ......................................... 333/17.3; 257/532
See application file for complete search history.

(56) References Cited

U.S. PATENT DOCUMENTS 6,396,342 B1   5/2002  Takenaka
7,071,792 B2 *  7/2006  Meck ..................... H03H 7/383
                                                333/124
(Continued)

FOREIGN PATENT DOCUMENTS

JP   1-279612   11/1989
JP   4-029403   1/1992
(Continued)

OTHER PUBLICATIONS

International Search Report of PCT application No. PCT/JP2013/004094 dated Aug. 20, 2013.

*Primary Examiner* — Stephen E Jones
*Assistant Examiner* — Scott S Outten
(74) *Attorney, Agent, or Firm* — McDermott Will & Emery LLP

(57) ABSTRACT

A semiconductor device includes a semiconductor chip, a dielectric substrate, and bonding wires. The dielectric substrate includes wiring patterns formed on a surface and a ground metal layer formed on a back side. The semiconductor chip includes an active element and a drain pad that is connected to an output end of the active element. Wiring pattern is formed at a position closer to the drain pad than wiring pattern, wiring pattern and the ground metal layer constitute a first capacitative element, and wiring pattern and the ground metal layer constitute a second capacitative element. The drain pad is connected to wiring pattern through bonding wire, and connected to wiring pattern through bonding wire. Bonding wire and the first capacitative element constitute a high-pass matching circuit.

14 Claims, 19 Drawing Sheets

(51) Int. Cl.
*H01L 27/06* (2006.01)
*H01L 29/20* (2006.01)
*H01L 29/778* (2006.01)
*H01L 29/861* (2006.01)
*H01L 49/02* (2006.01)
*H03K 3/01* (2006.01)

(52) U.S. Cl.
CPC ....... *H01L29/2003* (2013.01); *H01L 29/7787* (2013.01); *H01L 29/861* (2013.01); *H03H 7/38* (2013.01); *H03K 3/01* (2013.01)

(56) References Cited

U.S. PATENT DOCUMENTS

| | | | |
|---|---|---|---|
| 2005/0001235 A1 | 1/2005 | Murata et al. | |
| 2005/0236689 A1* | 10/2005 | Sugiura | H01L 23/49838 257/531 |
| 2006/0124960 A1 | 6/2006 | Hirose et al. | |
| 2011/0027974 A1* | 2/2011 | Su | C23C 16/4488 438/478 |
| 2011/0221033 A1 | 9/2011 | Boulay et al. | |

FOREIGN PATENT DOCUMENTS

| | | |
|---|---|---|
| JP | 8-293746 | 11/1996 |
| JP | 2738701 B | 4/1998 |
| JP | 2001-111364 | 4/2001 |
| JP | 2004-363563 | 12/2004 |
| JP | 2005-311852 | 11/2005 |
| JP | 2006-196869 | 7/2006 |
| JP | 2012-512556 | 5/2012 |

* cited by examiner

SEMICONDUCTOR DEVICE

TECHNICAL FIELD

The present invention relates to a semiconductor device.

BACKGROUND ART

In a microwave-band high-output power amplifier, there is a demand for high output and high gain to enhance the performance.

Group III-V nitride semiconductors, namely, mixed crystal materials, such as gallium nitride (GaN), aluminum nitride (AlN), and indium nitride, the general formula of which is $Al_xGa_{1-x-y}In_yN$ (where $0 \leq x \leq 1$ and $0 \leq y \leq 1$), have physical features of a wide band gap and a direct transition band structure. Therefore, because of the features of high breakdown electric field and saturated electron velocity, application to electronic devices is also studied in addition to application to short-wavelength optical elements.

Particularly, a Hetero-junction Field Effect Transistor (hereinafter, referred to as an HFET) in which 2-Dimensional Electron Gas (hereinafter, referred to as 2DEG) appearing at an interface between the $Al_xGa_{1-x}N$ layer (where $0 < x \leq 1$) and the GaN layer, which are sequentially formed on a semi-insulating substrate by epitaxial growth, is used is being developed as a high-output device or a high-frequency device. In the HFET, in addition to supply of electrons from a carrier supply layer (N-type AlGaN Schottky layer), charges are supplied by a polarization effect caused by spontaneous polarization and piezoelectric polarization, and therefore electron density of the HFET exceeds $10^{13}$ cm$^{-2}$, and is about an order of magnitude greater than an AlGaAs/GaAs HFET.

Thus, the HFET in which the group III-V nitride semiconductor is used is expected to have drain current density higher than that of the GaAs HFET, and it is reported that an HFET element has a maximum drain current exceeding 1 A/mm. Because the group III-V nitride semiconductor has the wide band gap (for example, GaN has a band gap of 3.4 eV), the group III-V nitride semiconductor exhibits a high withstand voltage characteristic, and the HFET in which the group III-V nitride semiconductor is used can achieve gate-drain electrode withstand voltages of 100 V or more. Thus, because the HFET can be expected to have the electric characteristic exhibiting the high withstand voltage and high current density, electronic devices typified by the HFET in which the group III-V nitride semiconductor is used are studied to be applied as a high-frequency element and an element that deals with large power with a design size smaller than ever before.

Additionally, with recent progress of an epitaxial growth technology, a technology of performing the epitaxial growth on not only a conventional lattice matching substrate such as SiC and sapphire but also an inexpensive Si substrate is actively developed.

For example, a matching circuit of a high-frequency transistor (for example, see PTL 1) and a high-frequency amplifier circuit including a high-pass circuit (for example, see PTL 2) are disclosed as the semiconductor device that can deal with the large power.

CITATION LIST

Patent Literature

PTL 1: Unexamined Japanese Patent Publication No. H04-29403

PTL 2: Unexamined Japanese Patent Publication No. H01-279612

SUMMARY OF THE INVENTION

However, in the conventional semiconductor device, there is a problem in that a linear gain decreases largely during high output or a problem in that a loss of a high-frequency signal increases to interrupt the high output and high gain.

An object of the present invention is to provide a semiconductor device operable with high output and high gain.

In accordance with one aspect of the present invention, a semiconductor device includes a semiconductor element, a dielectric substrate adjacent to the semiconductor element, and first wiring and second wiring that connect the semiconductor element and the dielectric substrate. The dielectric substrate includes a first metal layer and a second metal layer formed on a surface of the dielectric substrate and a ground metal layer formed on a back side of the dielectric substrate, and the semiconductor element includes an active element and an output terminal that is connected to an output end of the active element. The first metal layer is formed at a position closer to the output terminal of the semiconductor element than the second metal layer, the first metal layer and the ground metal layer form a first capacitative element, and the second metal layer and the ground metal layer form a second capacitative element. The output terminal is electrically connected to the first metal layer through the first wiring, and electrically connected to the second metal layer through the second wiring. The first wiring and the first capacitative element constitute a high-pass matching circuit that passes a signal of an operating frequency or more.

The first wiring and the first capacitative element constitute the high-pass matching circuit to decrease a difference between impedance during a large output operation and impedance during a small output operation in the semiconductor device. Therefore, the decrease in linear gain can be suppressed during large signal matching. That is, the high-output, high-gain semiconductor device can be made.

The semiconductor element may further include a first electrode and a third capacitative element that includes a grounded second electrode, the semiconductor device may further include third wiring that connects the output terminal of the semiconductor element and the first electrode of the capacitative element through the first wiring, and the high-pass matching circuit may further include the third wiring and the third capacitative element.

The high-pass matching circuit further includes the third wiring and the third capacitative element, so that the high-pass matching circuit having a desired characteristic can be designed without constraint on a thickness of the dielectric substrate and a wiring length of the first wiring. In other words, the high-pass matching circuit can be formed while the degree of design freedom of the semiconductor device is enhanced, and therefore the decrease in linear gain can be suppressed during the large signal matching.

The semiconductor element may further include a third capacitative element that includes a first electrode and a second electrode, a diode, and an application terminal that applies a bias voltage to one of an anode and a cathode of the diode, the one of the anode and the cathode of the diode may electrically be connected to the second electrode, the other of the anode and the cathode of the diode may be grounded, and the first electrode may electrically be connected to the first wiring.

Spread of a depletion layer generated in the diode can be adjusted by adjusting the bias voltage of the diode, and therefore a capacitance of the diode can be adjusted. The bias voltage is properly adjusted according to the operating frequency, which allows the characteristic of the high-pass matching circuit to be properly adjusted according to the operating frequency. As a result, even if the semiconductor device is operated in a wideband, the difference between the impedance during the large output operation and the impedance during the small output operation can be decreased to suppress the decrease in linear gain during the large signal matching.

The application terminal may be a bias applying pad that is of a metal electrode formed in the semiconductor element.

The semiconductor device may further include a detector circuit that detects output power of the semiconductor element and a bias voltage generator that generates the bias voltage based on a detection result of the detector circuit to apply the bias voltage to the terminal.

Therefore, the semiconductor device can be operated at a good-linearity output level at which back-off is performed from a saturated output point. Because a back-off level can be set by a bias voltage generator at any value, a low-distortion characteristic can be obtained in any modulation system by properly setting the back-off level according to a digital modulation system.

The semiconductor device may further include a detector circuit that detects input power of the semiconductor element and a bias voltage generator that generates the bias voltage based on a detection result of the detector circuit to apply the bias voltage to the terminal.

In accordance with another aspect of the present invention, a semiconductor device includes an active element formed on a substrate, a capacitive element formed on the substrate and provided adjacent to the active element, and stub wiring that is formed on the substrate and electrically connecting a first electrode of the capacitive element and an output terminal of the active element. The second electrode of the capacitive element is grounded, and the stub wiring and the capacitive element form a high-pass matching circuit that passes a signal of an operating frequency or more.

The stub wiring and the capacitive element constitute the high-pass matching circuit to decrease the difference between the impedance during the large output operation and the impedance during the small output operation in the semiconductor device. Therefore, the decrease in linear gain can be suppressed during large signal matching. That is, the high-output, high-gain semiconductor device can be made.

The active element may be made of a group-III nitride semiconductor.

In the semiconductor device of the present invention, the semiconductor device operable with high output and high gain can be made for the high-frequency use.

DESCRIPTION OF EMBODIMENTS

A general semiconductor device, particularly a high-frequency semiconductor device used in a power amplifier will be described in advance of the description of the semiconductor device according to an exemplary embodiment.

In the high-frequency semiconductor transistor (hereinafter, referred to as a transistor) used in the power amplifier, output impedance during a large signal operation decreases compared with output impedance during a small signal operation. That is, the output impedance during large output matching decreases compared with the output impedance during small output matching. The decrease in output impedance will be described below.

Figure 23:
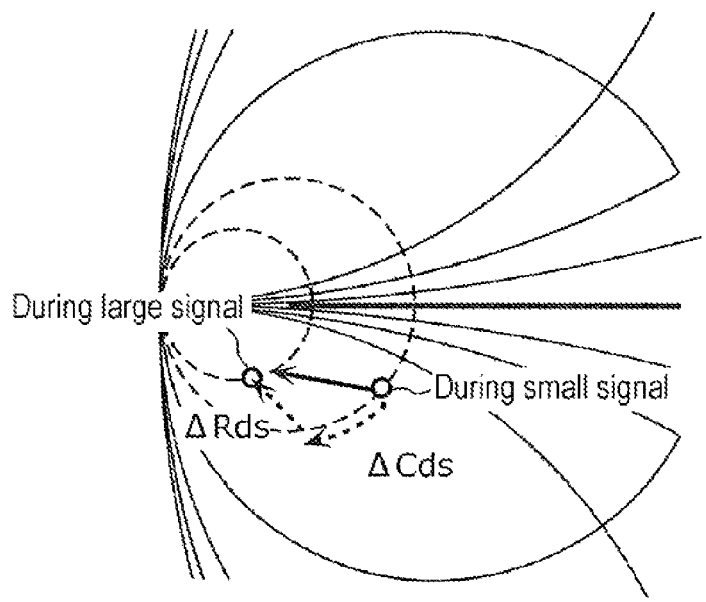
FIG. 23 is a Smith chart illustrating output impedance at which output power of a transistor is maximized during a large signal operation and a small signal operation.

FIG. 23 is a Smith chart illustrating the output impedance (optimum Zout) at which output power of the transistor is maximized during the large signal operation and the small signal operation. As illustrated in FIG. 23, during the large signal operation, compared to the small signal operation, optimum Zout shifts to low impedance of the range from a half to one thirds in terms of actual resistance component. Therefore, during the large output matching, the linear gain decreases largely from an original device performance gain. Hereinafter, in some cases the large signal operation and the small signal operation are referred to as a large signal and a small signal, respectively.

Figure 24:
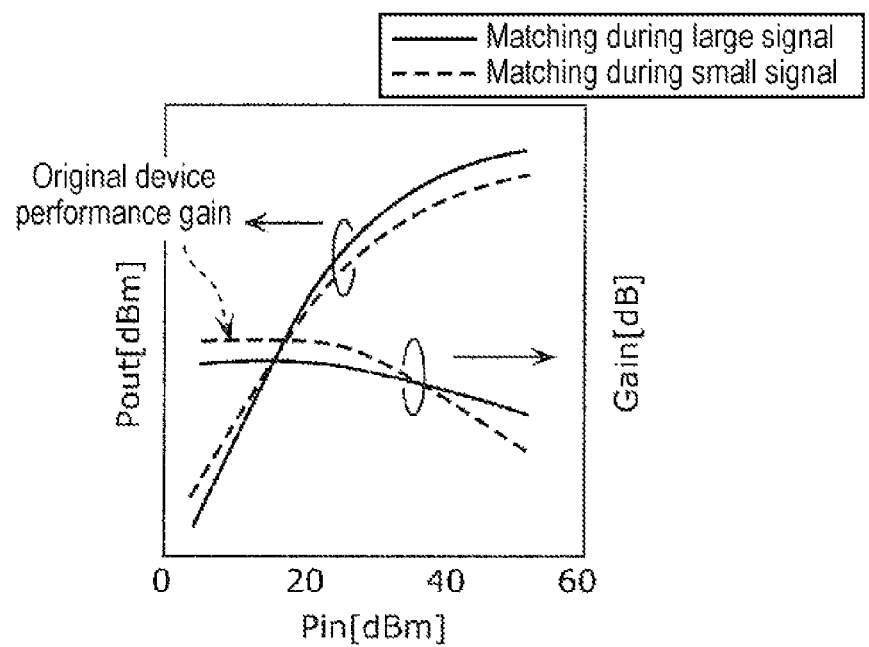
FIG. 24 is a graph illustrating a power input/output characteristic during small signal matching and large signal matching.

FIG. 24 is a graph illustrating a power input/output characteristic when input/output matching is performed during the small signal matching and the large signal matching.

Figure 25:
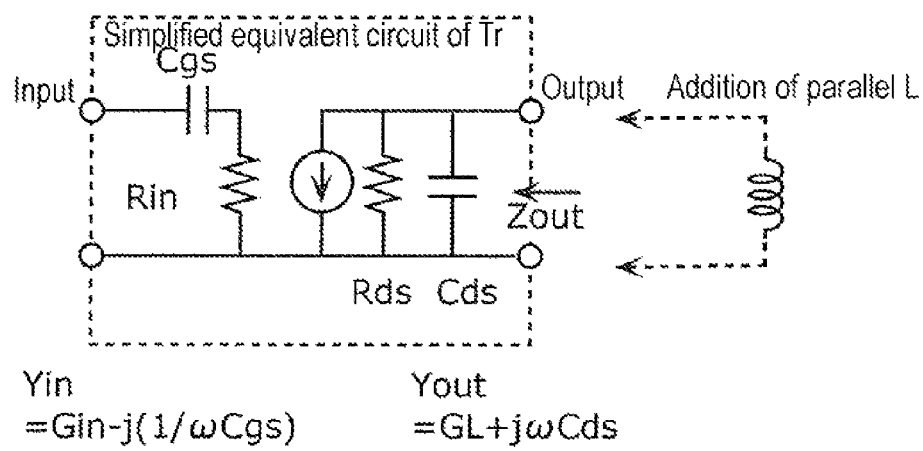
FIG. 25 is a simplified equivalent circuit diagram of the transistor.

FIG. 25 is a simplified equivalent circuit diagram of the transistor.

An input side is expressed by a series circuit of a gate-source capacitance (Cgs) and an input resistance (Rin), and an output side is expressed by a parallel circuit of a drain-source resistance (Rds) and a drain-source capacitance (Cds).

Because optimum Zout shifts to the low impedance due to a decrease in Rds and an increase in Cds during the large signal operation, the impedance shift can be suppressed to the minimum during the large signal operation when the increase in Cds is canceled. That is, the decrease in linear gain can also be suppressed.

In the transistor used in a high-output power amplifier, because a gate width is generally increased for a field effect transistor, the input/output impedance tends to decrease at a high frequency. The high-frequency input/output impedance is in the range from 2Ω to 3Ω or less as an actual resistance value. Because the usual impedance is 50Ω in a high-frequency block of a set such as a communication device, it is necessary to match an input/output terminal of the high-output power amplifier to 50Ω.

Figure 26:
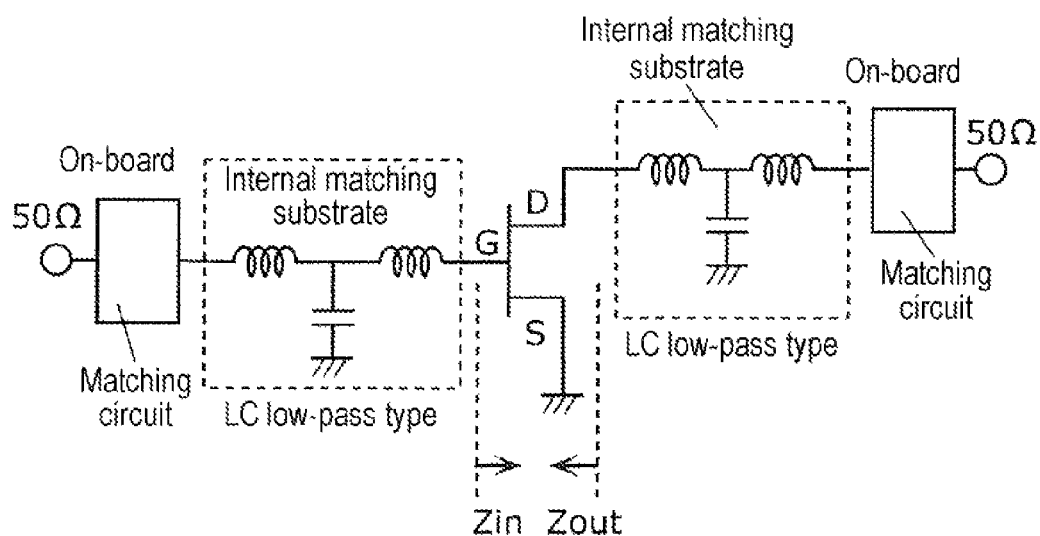
FIG. 26 is an equivalent circuit diagram illustrating the transistor and an internal matching circuit.

Generally, an internal matching circuit substrate is mounted as a pre-matching circuit in a neighborhood of the input/output side of the transistor. FIG. 26 is a lumped-constant equivalent circuit diagram of the internal matching circuit substrates. A low-pass circuit configuration constructed with a series inductance (L) and a parallel capacitance (C) is generally used in the input/output internal matching. The transistor and the internal matching substrate are generally connected to each other using a gold wire, and becomes a series L component. The transistor and the internal matching circuit substrate are mounted in a package made of an insulating material such as ceramic, and the package includes an input/output lead terminal.

In order to cancel the increase in Cds, conceptually an inductance component that is of a circuit element is added in parallel to the transistor to generate parallel resonance.

Figure 27:
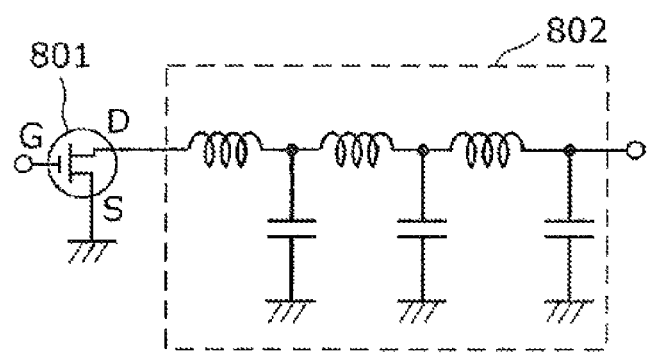
FIG. 27 is a circuit diagram illustrating a matching circuit of the transistor described in PTL 1.

FIG. 27 illustrates the matching circuit having the above form in FIG. 1 of PTL 1. Circuit 802 that performs the matching between field effect transistor (FET) 801 and a load is a low-pass circuit constructed with a series inductance (L) and a parallel capacitance (C).

The application of the high-pass circuit configuration constructed with the parallel circuit of the series inductance (L) and the series capacitance (C) is potentially capable of canceling the increase in Cds to suppress the impedance shift during the large signal operation to the minimum.

Figure 28A:
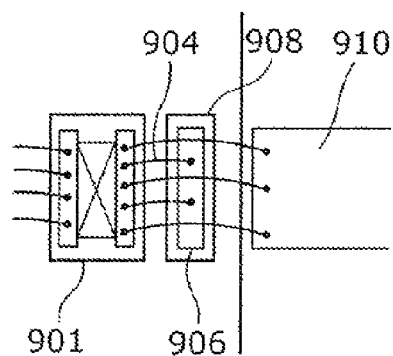
FIG. 28A is a plan view illustrating an exemplary configuration of the high-pass circuit described in PTL 2.

FIG. 28A is a plan view illustrating an exemplary configuration of the high-pass circuit described in PTL 2.

As illustrated in FIG. 28A, in the configuration of the high-pass circuit, one pad 906 in which a capacitor is formed is provided on dielectric chip 908 provided between transistor chip 901 and output strip line 910. An inductance value of metal wire 904 and a capacitance value of pad 906 are set such that series resonance is generated at a frequency double an operating frequency of transistor chip 901. At this point, only by parallel inductance of metal wire 904 that is of an inductance element, the inductance element is connected to a ground potential to pass a DC current. Therefore, the capacitor constituted of pad 906 is loaded in series with the inductance element. The connection of the element to the ground potential means that one end of the element is electrically connected to the ground electrode.

In a mathematical formula, a reactance component is expressed by (equation 1) with respect to a sum of inductance of an inductance component caused by metal wire 904 and a capacitance component caused by pad 906. A positive reactance component X constitutes an inductive impedance, and a negative reactance component X constitutes a capacitive impedance. In order to achieve the high-pass circuit configuration at the operating frequency, it is necessary that the reactance component X be the inductive impedance, namely, X>0.

$$XL + XC = jX \qquad \text{(Equation 1)}$$

In (equation 1), an inductance component XL is expressed by (equation 2) in terms of impedance, and a capacitance component XC is expressed by (equation 3) in terms of impedance.

$$XL = j(2\pi f)L \quad \text{(Equation 2)}$$

$$XC = 1/(j(2\pi f)C) \quad \text{(Equation 3)}$$

Where j is an imaginary unit, f is a frequency, and L is an inductance value of metal wire 904 and indicates a capacitance value caused by pad 906.

In PTL 2, the inductance and capacitance values are fixed such that the series resonance is generated at the frequency double the operating frequency, namely, such that X becomes 0. In this case, fixing the inductance and capacitance values correspond to fixing the length of metal wire 904 and fixing the area of pad 906, respectively.

In a form in which the inductance and the capacitance are connected in series with each other and connected in parallel to a transmission direction of the high-frequency signal, generally LC series resonance is generated at a frequency double a fundamental wave in order to suppress a second harmonic of the fundamental wave.

Figure 28B:
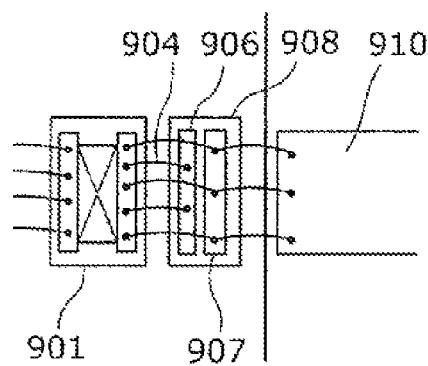
FIG. 28B is a plan view illustrating another exemplary configuration of the high-pass circuit.

FIG. 28B is a plan view illustrating another exemplary configuration of the high-pass circuit of PTL 2. Referring to FIG. 28B, pads 906 and 907 are arranged in two rows on dielectric chip 908 provided between transistor chip 901 and output strip line 910. Similarly to FIG. 28A, pad 906 constitutes the capacitor, and is provided in series with the inductance element constructed with metal wire 904.

However, in the semiconductor device of FIG. 27, the optimum output impedance still shifts to the low impedance of the range from a half to one thirds in terms of actual resistance component during the large signal operation, and the linear gain still decreases largely from the original device performance gain during the large output matching.

In the semiconductor device of FIGS. 28A and 28B, the LC series resonance is generated at a frequency double the fundamental wave in order to suppress the second harmonic of the operating frequency. Therefore, because X<0 holds in (equation 1) at the operating frequency, not the inductive impedance but the capacitive impedance is obtained, and the low-pass circuit to which the parallel capacitance is connected is made from the viewpoint of equivalent circuit. As a result, L necessary for impedance conversion decreases relative to the value of C, and a desired phase rotation amount of the reactance component X is lacked to generate an impedance mismatch.

It is also conceivable to increase the inductance component XL. In this case, the bonding wire and microstrip line, which contribute to the inductance component, are lengthened. When the bonding wire and the microstrip line are lengthened, a loss of the high-frequency signal increases due to resistance components of the bonding wire and microstrip line, which is obstructive to the high output and the high gain.

Thus, the high-output, high-gain power amplifier is hardly made for the high-frequency use.

Hereinafter, exemplary embodiments will specifically be described with reference to the drawings.

Each of the following exemplary embodiments illustrates a comprehensive or specific example. A numerical value, a shape, a material, a component, and an arrangement and a connection mode of components in the following exemplary embodiments are only by way of example, but do not restrict the present invention. In the components of the following exemplary embodiments, components that are not described in an independent claim indicating the highest concept are described as optional components.

First Exemplary Embodiment

Figure 1A:
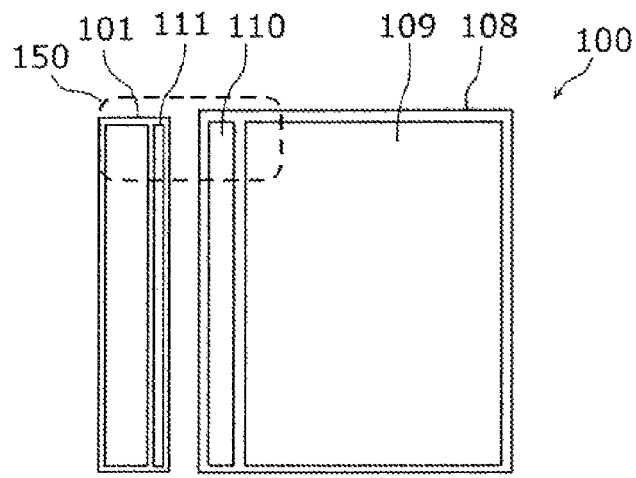
FIG. 1A is a plan view illustrating a configuration of a semiconductor device according to a first exemplary embodiment.
Figure 1B:
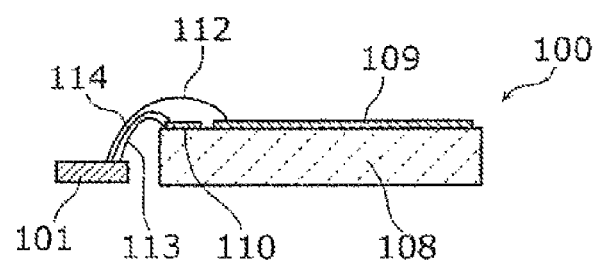
FIG. 1B is a sectional view illustrating the configuration of the semiconductor device.
Figure 2:
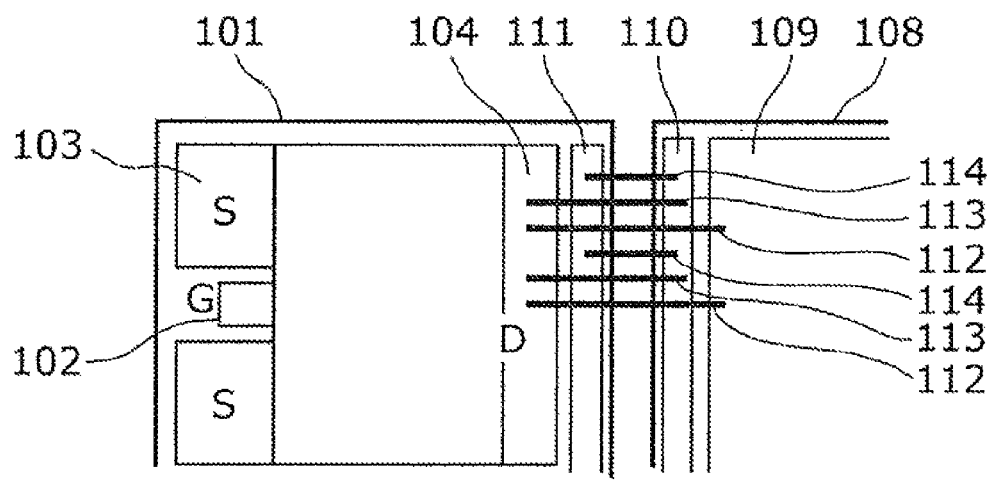
FIG. 2 is a partially enlarged view of FIG. 1A.

FIG. 1A is a plan view illustrating a configuration of a semiconductor device according to a first exemplary embodiment, and FIG. 1B is a sectional view of the semiconductor device. FIG. 2 is an enlarged view of region 150 indicated by a broken-line in FIG. 1A.

Semiconductor chip 101 that is of a semiconductor element for high-frequency use constitutes a gallium nitride (GaN) Hetero-junction Field Effect Transistor (HFET) (not illustrated) formed on a silicon substrate (not illustrated). Hereinafter, the gallium nitride hetero-junction field effect transistor is abbreviated to a GaN HFET. The silicon substrate has a high specific resistance, and the silicon substrate having a specific resistance of 1 Ω·cm or more is used. The silicon substrate has a thickness of 100 μm.

Semiconductor chip 101 is not limited to the semiconductor element in which the GaN HFET is used. For example, a gallium arsenide (GaAs) MESFET, a PHEMT, a Hetero-junction Bipolar Transistor (HBT), a Si MOSFET, a bipolar transistor, an HBT, and a InP transistor can be applied as semiconductor chip 101.

As illustrated in FIG. 2, gate pad 102, source pad 103, drain pad 104 are formed on semiconductor chip 101 by externally extracting a gate electrode, a source electrode, and a drain electrode in an intrinsic region of the GaN HFET. The GaN HFET has a total gate width of 48 mm, a unit finger length of 400 μm, and a unit finger interval of 50 μm. A ground electrode (not illustrated) having the ground potential is provided on a back side of semiconductor chip 101, namely, in an opposite surface to a surface of semiconductor chip 101 in which the GaN HFET is formed, and source pad 103 is electrically connected to the ground electrode on the back side of semiconductor chip 101. For example, the electric connection of source pad 103 to the ground electrode can be performed by wire bonding, or a through-hole is made in a silicon substrate of semiconductor chip 101 and a via hole is made by metalizing an inside of the through-hole to be able to perform the electric connection of source pad 103 to the ground electrode.

As to the size of semiconductor chip 101, the length in a longitudinal direction is 6.3 mm, and the length in a direction orthogonal to the longitudinal direction is 1.0 mm. The GaN HFET is operated with a saturated output of about 100 W at a frequency of 2.15 GHz, a drain voltage of 30 V, and an idling current (high-frequency power is not input yet) of 0.8 A.

Dielectric substrate 108 is alumina having a dielectric constant of 10, and dielectric substrate 108 has a thickness of 0.5 mm and a width substantially equal to the size of semiconductor chip 101. That is, the length of semiconductor chip 101 is substantially equal to the length of dielectric substrate 108 in the longitudinal direction of semiconductor chip 101.

Wiring patterns 109 and 110 are formed on dielectric substrate 108 by gold plating for example.

For example, a ground electrode (not illustrated) having the ground potential is formed over a whole back side of dielectric substrate 108.

A material having a dielectric constant of 93 or 38 can be applied as dielectric substrate 108. The thickness is selected according to the dielectric constant of the applied material. Dielectric substrate 108 is made of barium titanate ($BaTiO_3$) dielectric oxide, strontium zirconate ($SrZrO_3$) dielectric oxide, or a dielectric oxide in which a composition ratio thereof is changed. A balance among the dielectric constant, a distortion factor, and a capacitance-temperature characteristic is considered as a material characteristic.

In addition to the GaN HFET, MIM (Metal-Insulator-Metal) capacitor 111 is formed on semiconductor chip 101. Capacitor 111 is formed on a drain electrode side when viewed from the gate electrode of the GaN HFET. Capacitor 111 has a configuration in which a dielectric layer is laminated on a silicon substrate between an upper-layer electrode (not illustrated) and a lower-layer electrode (not illustrated).

For example, in capacitor 111, Ti/Au (titanium evaporation/gold plating) is used as a metal material for the upper-layer electrode, and Ti/Al/Ti is used as a metal material for the lower-layer electrode. For example, silicon nitride (SiN) or a high dielectric constant material such as strontium titanate ($SrTiO_3$) is used as the dielectric layer.

The size of capacitor 111 is such that the upper-layer electrode has a length of 6 mm in the longitudinal direction and a length of 0.15 mm in the direction orthogonal to the longitudinal direction and, in the case that silicon nitride (SiN) is used as the dielectric layer of capacitor 111, has a thickness of 150 nm.

One of the upper-layer electrode and the lower-layer electrode is electrically connected to the ground electrode on the back side of semiconductor chip 101. For example, generally the through-hole is made in the silicon substrate of semiconductor chip 101 and the inside of the through-hole is metalized to be able to perform the electric connection of capacitor 111 to the ground electrode.

Although not illustrated, preferably the through-hole is arranged between adjacent units that are obtained by dividing the MIM capacitor in the longitudinal direction of capacitor 111, as a method for electrically connecting capacitor 111 to the ground electrode.

For example, in the case that the through-holes are arranged at both ends in the longitudinal direction of capacitor 111, because the distance from the central portion of the MIM capacitor to the through-holes arranged at both the ends is large, a parasitic inductance corresponding to the length from the central portion to the through-hole possibly decreases the function of the capacitor. On the other hand, the arrangement of the through-hole between the adjacent units that are obtained by dividing the MIM capacitor can decrease the parasitic inductance and reduce the degradation of the function of the capacitor.

Semiconductor chip 101 and dielectric substrate 108 are arranged such that capacitor 111 and wiring pattern 110 face to each other. In other words, capacitor 111 of semiconductor chip 101 is arranged so as to be located on the side of dielectric substrate 108, and wiring pattern 110 of dielectric substrate 108 is arranged closer to semiconductor chip 101 than wiring pattern 109. A distance between a side of semiconductor chip 101 and a side of dielectric substrate 108, the sides facing each other, is about 400 µm.

Drain pad 104 of semiconductor chip 101 and wiring pattern 109 of dielectric substrate 108 are electrically connected to each other by bonding wire 112, and drain pad 104 of semiconductor chip 101 and wiring pattern 110 of dielectric substrate 108 are electrically connected to each other by bonding wire 113.

In wiring pattern 110, the length in the longitudinal direction is 6 mm, and the length in the direction orthogonal to the longitudinal direction is 0.3 mm.

Wiring extracted from one of the upper-layer electrode and lower-layer electrode of capacitor 111 formed on semiconductor chip 101 and wiring pattern 110 of dielectric substrate 108 are electrically connected to each other by bonding wire 114. FIG. 2 is the enlarged view of region 150 indicated by the broken-line in FIG. 1A, and some of the plurality of bonding wires 112 to 114 are omitted in FIG. 2. In FIG. 2, two wires as each of bonding wires 112, 113, and 114 are arranged, and other wires are omitted. Actually the plurality of bonding wires 112 to 114 are uniformly arranged in the longitudinal direction of drain pad 104.

Specifically, semiconductor chip 101 and dielectric substrate 108 are connected to each other by 13 bonding wires 112, 113, and 114 along the longitudinal directions of semiconductor chip 101 and dielectric substrate 108.

In the above configuration, capacitor 111 and dielectric substrate 108 are arranged on the drain side of semiconductor chip 101. Alternatively, capacitor 111 and dielectric substrate 108 may be arranged on the gate side of semiconductor chip 101.

As described above, semiconductor device 100 of the first exemplary embodiment includes semiconductor chip 101, dielectric substrate 108 that is arranged adjacent to semiconductor chip 101, and bonding wire 113 and bonding wire 112 that connect semiconductor chip 101 and dielectric substrate 108. Dielectric substrate 108 includes wiring pattern 110 and wiring pattern 109 that are formed on the surface and the ground electrode that is formed on the back side. Semiconductor chip 101 includes the GaN HFET and drain pad 104 that is connected to the drain of the GaN HFET. Wiring pattern 110 is formed at a position closer to drain pad 104 of semiconductor chip 101 than wiring pattern 109. Drain pad 104 is electrically connected to wiring pattern 110 through bonding wire 113, and electrically connected to wiring pattern 109 through bonding wire 112.

Semiconductor chip 101 further includes capacitor 111 including the upper-layer electrode and the lower-layer electrode in which one of the upper-layer electrode and the lower-layer electrode is grounded. Semiconductor device 100 further includes bonding wire 114 that connects drain pad 104 of semiconductor chip 101 and one of the upper-layer electrode and the lower-layer electrode of capacitor 111 through bonding wire 113.

Semiconductor chip 101, drain pad 104, bonding wire 113, bonding wire 112, bonding wire 114, wiring pattern 109, wiring pattern 110, and capacitor 111 correspond to the semiconductor element, the output terminal of the semiconductor element, the first wiring, the second wiring, the third wiring, the second metal layer, the first metal layer, and the third capacitative element, respectively. The ground electrode having the ground potential, which is formed on the back side of dielectric substrate 108, corresponds to the ground metal layer.

Figure 3:
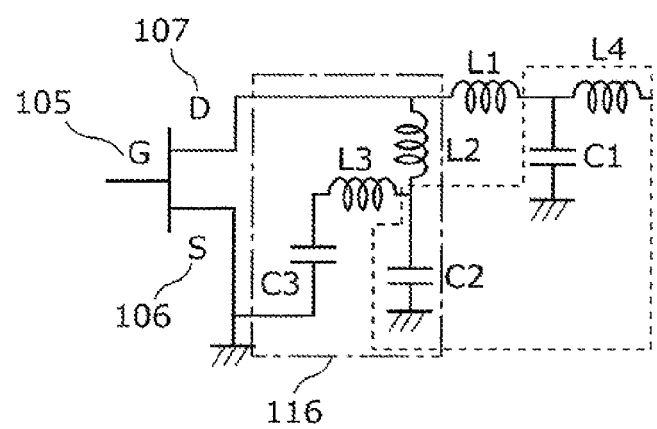
FIG. 3 is an equivalent circuit diagram of the semiconductor device of the first exemplary embodiment.

A configuration of semiconductor device 100 of the first exemplary embodiment will be described below with reference to an equivalent circuit diagram in FIG. 3. In FIG. 3, the output matching circuit of semiconductor chip 101 is connected as follows.

The GaN HFET includes gate terminal 105, source terminal 106, and drain terminal 107. Series inductor L1 constituted of bonding wire 112 and parallel capacitor C1 constituted of wiring pattern 109 are connected to drain terminal 107, and a series circuit of inductor L2 constituted of bonding wire 113 and capacitor C2 constituted of wiring pattern 110 is connected to drain terminal 107. In dielectric substrate 108, capacitors C1 and C2 are ground capacitances formed between wiring patterns 109 and 110 and the ground electrode on the back side connected to the ground potential.

The series circuit of inductor L3 constituted of bonding wire 114 and capacitor C3 is connected to a connection point of inductor L2 and capacitor C2. Capacitor C3 corresponds to capacitor 111 in FIG. 2.

In FIG. 3, the configuration surrounded by the broken line is the equivalent circuit portion of the configuration that is formed on dielectric substrate 108. Bonding wire 114 is provided from wiring pattern 110 formed on dielectric substrate 108 for the internal matching circuit to semiconductor chip 101.

That is, in semiconductor device 100 of the first exemplary embodiment, the circuit constructed with inductor L2 and capacitor C2 and the circuit constructed with inductor L3 and capacitor C3 are added to LC low-pass circuit, which is constructed with series inductor L1 and parallel capacitor C1, so as to act as LC high-pass matching circuit 116.

In other words, capacitor C2 is constructed with wiring pattern 110 and the ground electrode, capacitor C1 is constructed with wiring pattern 109 and the ground electrode, and LC high-pass matching circuit 116 that passes the signal having the operating frequency or more is constructed with inductor L2 constituted of bonding wire 113 and capacitor C2. LC high-pass matching circuit 116 further includes inductor L3 constituted of bonding wire 114 and capacitor C3.

Capacitor C1 constructed with wiring pattern 109 and the ground electrode corresponds to the second capacitive element, capacitor C2 constructed with wiring pattern 110 and the ground electrode corresponds to the first capacitive element, and LC high-pass matching circuit 116 corresponds to the high-pass matching circuit.

The inductance and capacitance enough to satisfy X>0 of (equation 1) can be obtained by adding LC high-pass matching circuit 116 constructed with inductor L2, capacitor C2, inductor L3, and capacitor C3 to drain terminal 107 that is the output terminal of semiconductor chip 101. The inductance and the capacitance are adjusted by adjusting a wire length of bonding wire 113 and a pattern size of capacitor 111.

Currently-studied LC high-pass matching circuit 116 has inductor L2 of 135 pH, capacitor C2 of 0.88 pF, inductor L3 of 110 pH, and capacitor C3 of 360 pF. These values are equivalent values of a total of bonding wires 112, 113, and 114 in semiconductor device 100.

A characteristic of semiconductor device 100 of the first exemplary embodiment will be described below using a comparative example. Specifically, a difference in characteristic between semiconductor device 100 of the first exemplary embodiment including LC high-pass matching circuit 116 and a semiconductor device of the comparative example that does not include LC high-pass matching circuit 116 will be described below.

Figure 4:
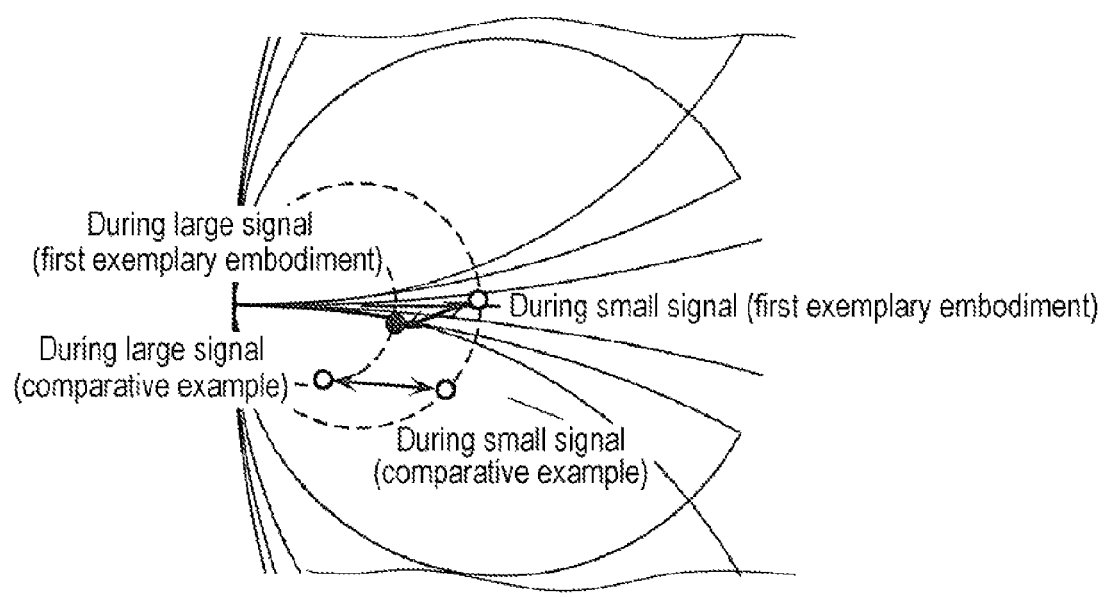
FIG. 4 is a Smith chart illustrating a difference in characteristic between the semiconductor device of the first exemplary embodiment and a semiconductor device of a comparative example.

FIG. 4 is a Smith chart illustrating the impedance during the small signal and the impedance during the large signal in semiconductor device 100 of the first exemplary embodiment and the semiconductor device of the comparative example.

FIG. 4 illustrates mismatch degrees of the impedance during the small signal and the impedance during the large signal in the semiconductor device of the comparative example and semiconductor device 100 of the first exemplary embodiment.

At this point, a return loss (rl) is used as an index expressing the mismatch degree of the impedance (impedance difference). The mismatch degree increases with decreasing return loss.

For example, absence of the impedance mismatch results in standing wave ratio SWR=1 (reflection coefficient of 0, without reflection), which means infinite. The increased impedance mismatch results in standing wave ratio SWR<1 (reflection coefficient, with reflection), and comes close to 0.

$$\text{return loss } rl = -20 \, \text{Log} |\rho| \quad \text{(Equation 4)}$$

$$\text{reflection coefficient } \rho = (Z-Z0)/(Z+Z0) \quad \text{(Equation 5)}$$

$$|\rho| = (SWR-1)/(SWR+1) \quad \text{(Equation 6)}$$

$$\text{standing wave ratio } SWR = (1+|\rho|)/(1-|\rho|) \quad \text{(Equation 7)}$$

Where Z0 is reference impedance and Z is impedance of a comparative target.

The return losses in the cases (1) and (2) are calculated and compared.

(1) The calculation of the return loss of the impedance during the large signal of the semiconductor device of the comparative example based on the impedance during the small signal of the semiconductor device of the comparative example (2) The calculation of the return loss of the impedance during the large signal of semiconductor device 100 of the first exemplary embodiment based on the impedance during the small signal of semiconductor device 100 of the first exemplary embodiment At this point, the output impedance during the small signal of the semiconductor device of the comparative example is 1.5−j·2.0 (Ω), and the output impedance during the large signal is 0.6−j·1.0 (Ω). The output impedance during the small signal of semiconductor device 100 of the first exemplary embodiment is 4.1+j·0.1 (Ω), and the output impedance during the large signal is 2.2−j·0.4 (Ω).

(1) The semiconductor device of the comparative example has a return loss of 8.7 dB, and (2) semiconductor device 100 of the first exemplary embodiment has a return loss of 10.1 dB.

It is found that semiconductor device 100 of the first exemplary embodiment is smaller than the semiconductor device of the comparative example in the difference between the impedance during the large output operation and the impedance during the small output operation of the device and the mismatch degree. The small difference between the impedance during the large output operation and the impedance during the small output operation of the device means that the linear gain is hardly decreased during the large signal matching. Therefore, in semiconductor device 100 of the first exemplary embodiment, the decrease in linear gain during large signal matching can be suppressed by applying LC high-pass matching circuit 116.

Figure 5A:
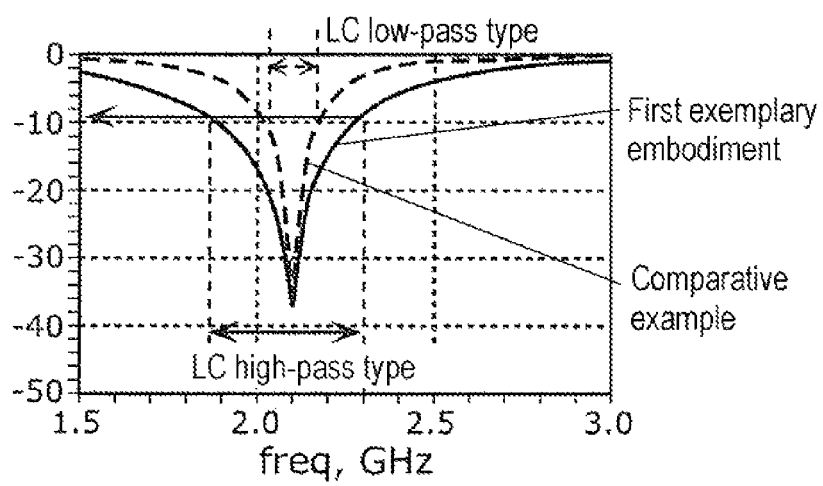
FIG. 5A is a graph illustrating frequency characteristics of return losses during 50-ohm matching in the semiconductor device and the comparative example.
Figure 5B:
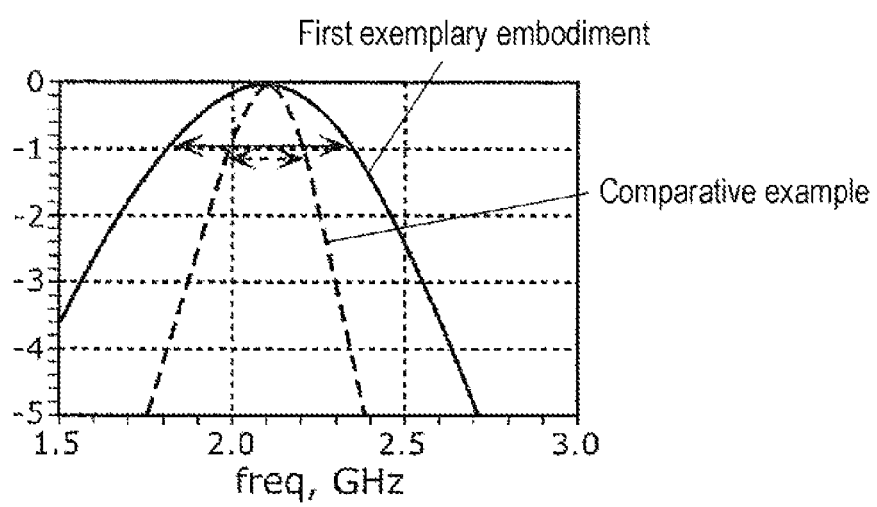
FIG. 5B is a graph illustrating frequency dependence of a loss in the semiconductor device and the comparative example.

FIGS. 5A and 5B illustrate differences in return loss and loss characteristic during the 50-ohm matching between semiconductor device 100 of the first exemplary embodiment and the semiconductor device of the comparative example.

FIG. 5A is a graph illustrating frequency characteristics of the return losses during 50-ohm matching in semiconductor device 100 of the first exemplary embodiment and the semiconductor device of the comparative example, and FIG. 5B is a graph illustrating the loss characteristics in semiconductor device 100 of the first exemplary embodiment and the semiconductor device of the comparative example. As can be seen from FIGS. 5A and 5B, semiconductor device 100 of the first exemplary embodiment is better than the semiconductor device of the comparative example over the wideband in both the return loss and the loss characteristic during the 50-ohm matching.

In semiconductor device 100 of the first exemplary embodiment including LC high-pass matching circuit 116, the wideband can be achieved in terms of the matching and the loss characteristic compared with the semiconductor device of the comparative example that does not include LC high-pass matching circuit 116.

As described above, semiconductor device 100 of the first exemplary embodiment includes semiconductor chip 101, dielectric substrate 108 that is arranged adjacent to semiconductor chip 101, and bonding wire 113 and bonding wire 112 that connect semiconductor chip 101 and dielectric substrate 108. Dielectric substrate 108 includes wiring pattern 110 and wiring pattern 109 that are formed on the surface and the ground electrode that is formed on the back side. Semiconductor chip 101 includes the GaN HFET and drain pad 104 that is connected to the drain of the GaN HFET. Wiring pattern 110 is formed at the position closer to drain pad 104 of semiconductor chip 101 than wiring pattern 109, wiring pattern 110 and the ground electrode constitute capacitor C2, and wiring pattern 109 and the ground electrode constitute capacitor C1. Drain pad 104 is electrically connected to wiring pattern 110 through bonding wire 113, and electrically connected to wiring pattern 109 through bonding wire 112. LC high-pass matching circuit 116 that passes the signal having the operating frequency or more is constructed with inductor L2 constituted of bonding wire 113 and capacitor C2. As used herein, the operating frequency means a frequency at which semiconductor device 100 is operated.

Therefore, in semiconductor device 100, the difference between the impedance during the large output operation and the impedance during the small output operation can be decreased to suppress the decrease in linear gain during the large signal matching.

As a result, semiconductor device 100 of the first exemplary embodiment can obtain the high output and the high gain for the high-frequency use.

First Modification of First Exemplary Embodiment

The shapes of wiring patterns 109 and 110 are not limited to the above shapes. Alternatively, for example, wiring patterns 109 and 110 may have shapes of a first modification.

Figure 6A:
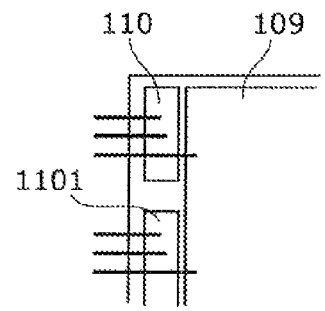
FIG. 6A is a plan view illustrating a configuration of a semiconductor device according to a first modification of the first exemplary embodiment.
Figure 6B:
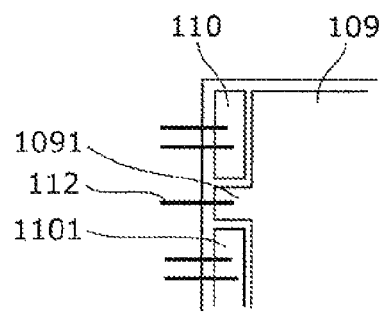
FIG. 6B is a plan view illustrating another configuration of the semiconductor device of the first modification.
Figure 6C:
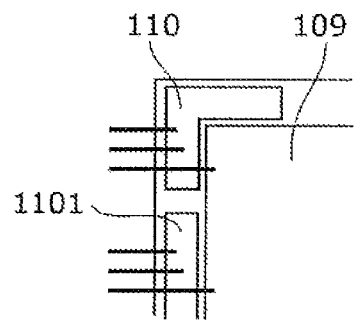
FIG. 6C is a plan view illustrating still another configuration of the semiconductor device of the first modification.

FIGS. 6A to 6C illustrate the first modification of wiring patterns 109 and 110 on dielectric substrate 108 in FIG. 2 in the first exemplary embodiment.

As illustrated in FIG. 6A, wiring pattern 110 can be divided to provide wiring pattern 1101 according to a set of bonding wires 112, 113, and 114 formed on drain pad 104.

As illustrated in FIG. 6B, compared with the configuration in FIG. 6A, protrusion 1091 of wiring pattern 109 can be formed in a space between wiring pattern 110 and wiring pattern 1101, and bonding wire 112 can be connected to protrusion 1091.

As illustrated in FIG. 6C, bent wiring pattern 110 can be formed in an end portion of dielectric substrate 108.

In the semiconductor device of the first modification including any of the wiring patterns in FIGS. 6A to 6C, similarly to semiconductor device 100 of the first exemplary embodiment, because the LC high-pass matching circuit that generates the parallel resonance at the operating frequency is added to Cds of semiconductor chip 101, Cds is decreased to improve the high-frequency characteristic.

Therefore, the effect similar to that of semiconductor device 100 of the first exemplary embodiment is obtained in the semiconductor device of the first modification including any of the wiring patterns in FIGS. 6A to 6C.

Second Modification of First Exemplary Embodiment

A semiconductor device according to a second modification of the first exemplary embodiment differs from semiconductor device 100 of the first exemplary embodiment in that an element constituting inductor L2 is constructed with the wiring pattern formed on semiconductor chip 101 and the bonding wire connecting semiconductor chip 101 and dielectric substrate 108 in the equivalent circuit of the semiconductor device, and that the semiconductor device of the second modification does not include capacitor 111 and bonding wire 114 connecting wiring pattern 110 and capacitor 111.

Figure 7A:
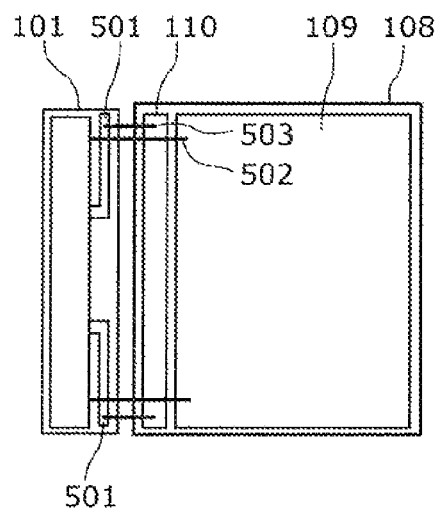
FIG. 7A is a plan view illustrating a configuration of a semiconductor device according to a second modification of the first exemplary embodiment.
Figure 7B:
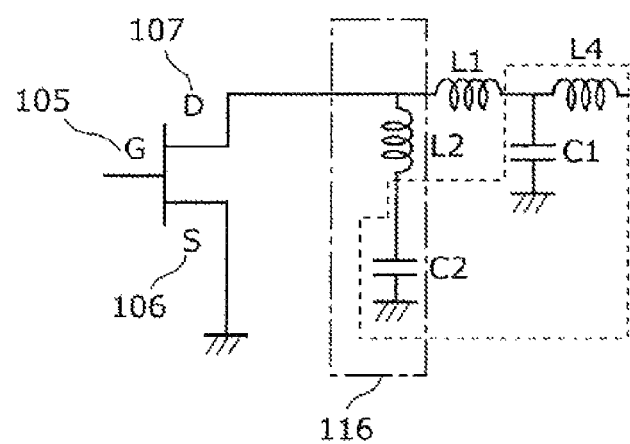
FIG. 7B is an equivalent circuit diagram of the semiconductor device of the second modification.

FIG. 7A is a plan view illustrating a configuration of the semiconductor device of the second modification, and FIG. 7B is an equivalent circuit diagram of the semiconductor device of the second modification.

A difference between the configuration in FIGS. 7A and 7B and the configuration in FIGS. 1A to 3 will be described below.

Referring to FIG. 7A, drain pad 104 and wiring pattern 501 of semiconductor chip 101 are electrically connected to each other, wiring pattern 501 and wiring pattern 109 are electrically connected to each other by bonding wire 503, and drain pad 104 and wiring pattern 109 are electrically connected to each other by bonding wire 502. Wiring patterns 501, bonding wires 502, and bonding wires 503 are symmetrically arranged with respect to the central portion in the longitudinal direction of semiconductor chip 101. As to bonding wires 502, although other bonding wires in the longitudinal direction are omitted in FIG. 7A, actually the bonding wires are uniformly arranged in the longitudinal direction of drain pad 104.

In the equivalent circuit of the semiconductor device of the second modification in FIG. 7B, the inductance component caused by wiring pattern 501 is included in inductor L2 constituted of bonding wire 503 in FIG. 3.

In FIG. 7B, capacitor C2 constituted of wiring pattern 109 is formed, and LC high-pass matching circuit 116 is constructed with inductor L2 and capacitor C2.

Therefore, in the semiconductor device of the second modification, similarly to semiconductor device 100 of the first exemplary embodiment, because LC high-pass matching circuit 116 that generates the parallel resonance at the operating frequency is added to Cds of semiconductor chip 101, Cds is decreased to improve the high-frequency characteristic.

Therefore, the effect similar to that of semiconductor device 100 of the first exemplary embodiment is obtained in the semiconductor device of the second modification in FIGS. 7A and 7B.

Third Modification of First Exemplary Embodiment

A semiconductor device according to a third modification of the first exemplary embodiment is substantially identical to the semiconductor device of the second modification, and the semiconductor device of the third modification differs from the semiconductor device of the second modification in that the semiconductor device of the third modification includes a capacitor between adjacent wiring patterns 501 and a bonding wire connecting wiring pattern 110 and the capacitor.

Figure 8A:
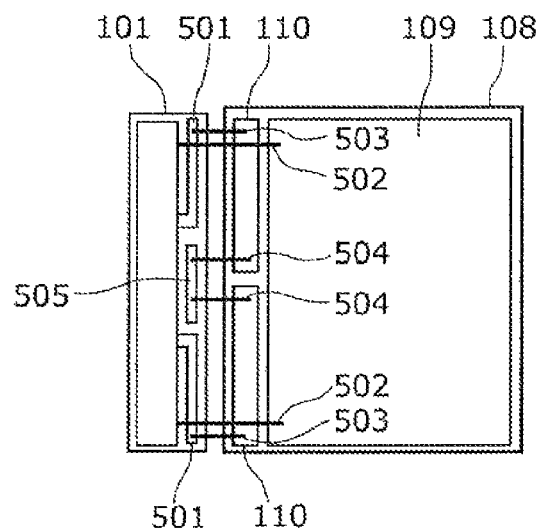
FIG. 8A is a plan view illustrating a configuration of a semiconductor device according to a third modification of the first exemplary embodiment.
Figure 8B:
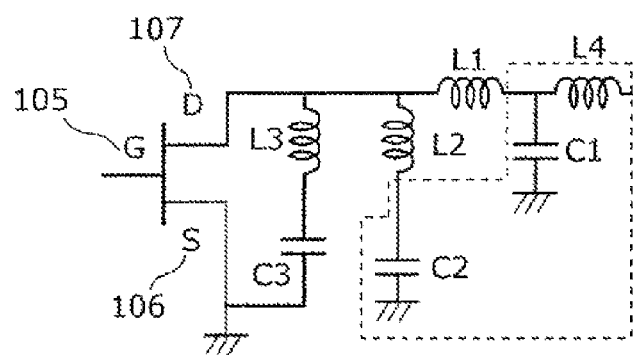
FIG. 8B is an equivalent circuit diagram of the semiconductor device the third modification.

FIG. 8A is a plan view illustrating a configuration of the semiconductor device of the third modification, and FIG. 8B is an equivalent circuit diagram of the semiconductor device of the third modification.

Referring to FIG. 8A, drain pad 104 and wiring pattern 501 of semiconductor chip 101 are electrically connected to each other, wiring pattern 501 and wiring pattern 110 are electrically connected to each other by bonding wire 503, drain pad 104 and wiring pattern 109 are electrically connected to each other by bonding wire 502, and wiring pattern 110 and capacitor 505 formed on semiconductor chip 101 are electrically connected to each other by bonding wire 504. Wiring patterns 501, bonding wires 502, bonding wires 503, and bonding wires 504 are symmetrically arranged with respect to a central portion in the longitudinal direction of semiconductor chip 101. As to bonding wires 502, although other bonding wires in the longitudinal direction are omitted in FIG. 8A, actually the bonding wires are uniformly arranged in the longitudinal direction of drain pad 104. Capacitor 505 is prepared while having the configuration similar to that of capacitor 111. Compared with wiring pattern 110 in FIG. 7A, wiring pattern 110 is divided at the central portion. Capacitor 505 may also symmetrically be divided at the central portion in the longitudinal direction.

In FIG. 8B, bonding wire 504 corresponds to inductor L3, and capacitor 505 corresponds to capacitor C3. In the semiconductor device of the third modification, the LC high-pass matching circuit is formed by inductor L2, capacitor C2, inductor L3, and capacitor C3.

Therefore, in the semiconductor device of the third modification, similarly to semiconductor device 100 of the first exemplary embodiment, because the LC high-pass matching circuit that generates the parallel resonance at the operating frequency is added to Cds of semiconductor chip 101, Cds is decreased to improve the high-frequency characteristic.

Therefore, the effect similar to that of semiconductor device 100 of the first exemplary embodiment is obtained in the semiconductor device of the third modification in FIGS. 8A and 8B.

In semiconductor device 100 of the first exemplary embodiment and semiconductor devices of the first to third modifications, when the wire length and the wiring pattern size are fixed such that the inductance and the capacitance are similarly obtained with respect to the gate-source capacitance of semiconductor chip 101, the inductance and the capacitance generate the parallel resonance at the operating frequency. As a result, Cgs is decreased to improve the high-frequency characteristic. That is, the LC high-pass matching circuit may be provided on the input side of semiconductor chip 101.

In the first exemplary embodiment and the first to third modifications of the first exemplary embodiment, the LC high-pass matching circuit is configured with inductor L2 and capacitor C2 (FIG. 8A), or the LC high-pass matching circuit is constructed with inductors L2 and L3 and capacitors C2 and C3 (FIG. 1A and others).

In the case that the LC high-pass matching circuit is constructed with inductor L2 and capacitor C2, the capacitance value necessary to satisfy X>0 of (equation 1) in capacitor C2 is obtained as follows.

Specifically, in the output matching circuit, because the impedance is converted by inductor L1 and capacitor C1 to perform the matching with 50Ω, the characteristic impedance of the wiring on dielectric substrate 108 is set to the desired value or more. For this reason, the thickness of dielectric substrate 108 is increased greater than or equal to a desired thickness.

However, when the thickness of dielectric substrate 108 is excessively increased, the capacitance value of capacitor C2 is decreased with increasing thickness of dielectric substrate 108. In this case, at the operating frequency, X<0 is obtained in (equation 1), and in some cases the impedance is not inductive but capacitive. For the capacitive impedance, the low-pass circuit in which the parallel capacitor is connected is obtained from the viewpoint of equivalent circuit.

For this reason, in order not to obtain the capacitive impedance, it is conceivable that bonding wire 113 is lengthened to increase inductance component XL of (equation 2). However, when bonding wire 113 is excessively lengthened, the lengths of the bonding wire and microstrip line, which cause the inductance component, are lengthened, and the loss of the high-frequency signal increases due to the resistance components of the bonding wire and microstrip line, which is obstructive to the high output and the high gain.

That is, for the LC high-pass matching circuit constructed with inductor L2 and capacitor C2, there is a limitation to the thickness of dielectric substrate 108 or the length of bonding wire 113 when the desired LC high-pass matching circuit is obtained.

On the other hand, for the LC high-pass matching circuit constructed with inductors L2 and L3 and capacitors C2 and C3, the LC high-pass matching circuit having the better characteristic can be obtained because of no constraint on the thickness of dielectric substrate 108 or the length of bonding wire 113. Therefore, the characteristic of the semiconductor device can further be improved.

Compared with the semiconductor device of the second modification of the first exemplary embodiment including the LC high-pass matching circuit constructed with inductor L2 and capacitor C2, the LC high-pass matching circuit having the higher degree of design freedom can be made in semiconductor device 100 of the first exemplary embodiment including the LC high-pass matching circuit constructed with inductors L2 and L3 and capacitors C2 and C3 and the semiconductor devices of the first and third modifications of the first exemplary embodiment. As a result, the decrease in linear gain can be suppressed during large signal matching.

Second Exemplary Embodiment

A semiconductor device according to a second exemplary embodiment differs from semiconductor device 100 of the first exemplary embodiment in that the semiconductor device of the second exemplary embodiment does not include the dielectric substrate and the bonding wire connecting the semiconductor chip and the dielectric substrate. That is, the semiconductor device of the second exemplary embodiment includes a capacitative element that is formed on a semiconductor chip and provided adjacent to the GaN HFET and stub wiring that is formed on the semiconductor chip to electrically connect one of electrodes of the capacitative element and an output terminal of the GaN HFET. The other electrode of the capacitative element is grounded, and the stub wiring and the capacitative element constitute the high-pass matching circuit that passes the signal having the operating frequency or more.

Figure 9:
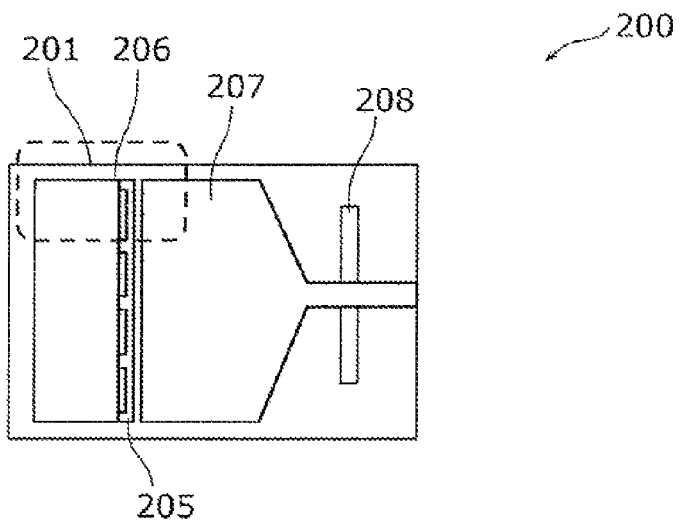
FIG. 9 is a plan view illustrating a configuration of a semiconductor device according to a second exemplary embodiment.
Figure 10:
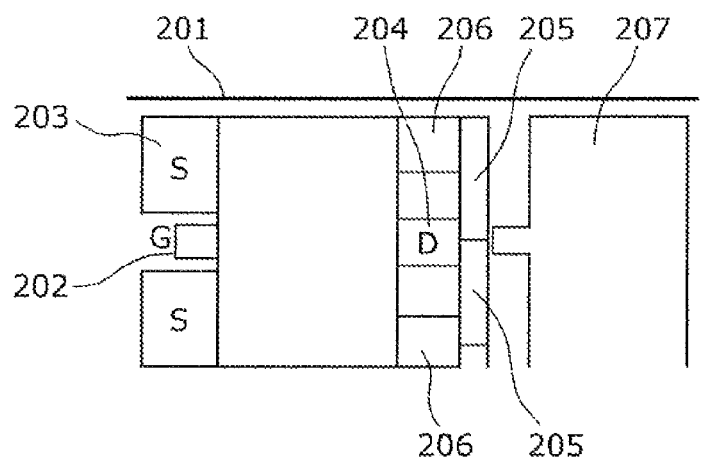
FIG. 10 is a partially enlarged view of FIG. 9.
Figure 11:
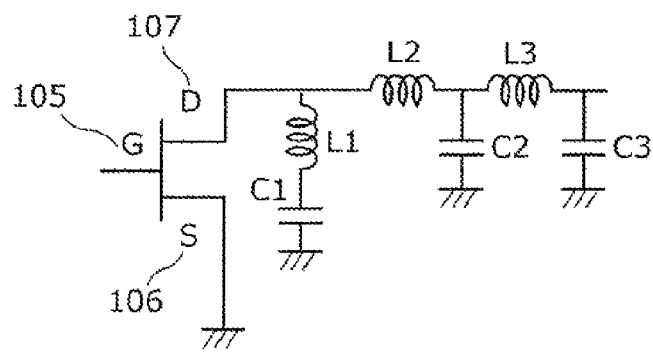
FIG. 11 is an equivalent circuit diagram of the semiconductor device of the second exemplary embodiment.

FIG. 9 is a plan view illustrating a configuration of the semiconductor device of the second exemplary embodiment, FIG. 10 is an enlarged view of a region indicated by a broken-line in FIG. 9, and FIG. 11 is an equivalent circuit diagram of the semiconductor device of the second exemplary embodiment. Specifically, FIG. 10 illustrates a configuration of the unit cell having a gate width of 450 μm.

A specific configuration required for the semiconductor device in the case that the semiconductor device is applied to a quasi-millimeter wave band or a millimeter wave band that is a higher frequency band than the microwave band will be described below.

In the case that the impedance matching of the power amplifier in the quasi-millimeter wave band or millimeter wave band is performed, it is not preferable to apply the bonding wire used in semiconductor device 100 of the first exemplary embodiment. This is because a wavelength (electrical length) of an electromagnetic wave transmitted on the dielectric substrate is shorter in the quasi-millimeter wave band and the millimeter wave band than in the microwave band. For this reason, in the case that the impedance matching is performed using the bonding wire, it is necessary to shorten the length of the bonding wire as much as possible in order to adjust the phase rotation amount of the impedance caused by the inductance component. However, in the configuration in which the bonding wire is used, variation in length generated in performing bonding with a wire bonder causes variation in inductance component, which results in variation of the impedance matching. Because the variation in impedance matching increases in proportional to the frequency, generally the bonding wire is not used as much as possible in the quasi-millimeter wave band and the millimeter wave band.

Preferably the LC high-pass matching circuit has a configuration of an MMIC (Monolithic Microwave IC) prepared on the same substrate as the GaN HFET.

Therefore, semiconductor device 200 of the second exemplary embodiment is configured as follows.

The GaN HFET of the first exemplary embodiment is formed as an active device on semiconductor chip 201. As illustrated in FIG. 10, gate extraction wiring 202, source pad 203, and drain extraction wiring 204 are formed by externally extracting the gate, source, and drain electrodes in the intrinsic region of the GaN HFET. The GaN HFET has a total gate width of 2.7 mm, a unit finger length of 75 µm, and a unit finger interval of 30 µm. In the GaN HFET, the six unit cells having a gate width of 450 µm are connected in parallel.

Source pad 203 is electrically connected to a ground electrode on the back side of semiconductor chip 201. For example, the through-hole is made in the silicon substrate of semiconductor chip 201 and the inside of the through-hole is metalized to be able to perform the electric connection of source pad 203 to the ground electrode.

As to the size of semiconductor chip 201, the length in the longitudinal direction is 2.4 mm, and the length in the direction orthogonal to the longitudinal direction is 0.55 mm. The GaN HFET is operated with a saturated output of about 2 W at a frequency of 25 GHz, a drain voltage of 20 V, and an idling current (high-frequency power is not input yet) of 0.5 A.

The case that the configuration of the LC high-pass matching circuit is applied to the drain side of the GaN HFET on semiconductor chip 201 will be described below. The configuration of the LC high-pass matching circuit can also be applied to a gate side of the GaN HFET on semiconductor chip 201.

At the leading end of drain extraction wiring 204 of semiconductor chip 201, leading-end short-circuit stub-forming stub wiring 205 (also referred to as a short stub-forming stub wiring) is electrically connected while branched in the longitudinal direction of the GaN HFET. MIM (Metal-Insulator-Metal) capacitor 206 is formed at a leading end of stub wiring 205. Stub wiring 205 has a wiring width of 25 µm and a length of 450 µm.

MIM capacitor 206 has a configuration in which the dielectric layer is laminated on the silicon substrate between the upper-layer electrode (not illustrated) and the lower-layer electrode (not illustrated). For example, Ti/Au (titanium evaporation/gold plating) is used as the metal material for the upper-layer electrode, and Ti/Al/Ti is used as the metal material for the lower-layer electrode.

For example, silicon nitride (SiN) or a high dielectric constant material such as strontium titanate ($SrTiO_3$) is used as the dielectric layer. One of the upper-layer electrode and the lower-layer electrode is electrically connected to the ground electrode on the back side of semiconductor chip 201. For example, the through-hole is made in the silicon substrate of semiconductor chip 201 and the inside of the through-hole is metalized to be able to perform the electric connection to the ground electrode.

The size of capacitor 206 is such that the upper-layer electrode is 130-um-square. Silicon nitride (SiN) has a thickness of 150 nm, and capacitor 206 has an intrinsic capacitance value of 6.8 pF.

For example, the through-hole is made in the silicon substrate of semiconductor chip 201 and a via hole is made by metalizing the inside of the through-hole to be able to perform the electric connection to the ground electrode. Alternatively, the electric connection to the ground electrode may be performed by connecting one of the upper-layer electrode and the lower-layer electrode to the source electrode of the GaN HFET.

Generally the short stub is constructed with a distributed constant line, and a leading-end portion of the line is connected to the ground potential. In order to block the DC current, it is necessary for the short stub to have a form in which the capacitor is loaded in series with the distributed constant line, thereby constituting the LC high-pass matching circuit.

In semiconductor device 200 of the second exemplary embodiment, wiring pattern 207 and open stub 208 are formed on semiconductor chip 201 by gold plating in order to perform the 50-ohm output matching of the power amplifier.

Wiring pattern 207 is electrically connected in the region where stub wiring 205 is branched from drain extraction wiring 204.

A configuration of semiconductor device 200 of the second exemplary embodiment will be described below with reference to an equivalent circuit diagram in FIG. 11. In FIG. 11, the output matching circuit of semiconductor chip 201 is connected as follows.

The series circuit of inductor L1 constituted of stub wiring 205 and capacitor C1 is connected to drain terminal 107. At this point, capacitor C1 corresponds to capacitor 206 in FIG. 10. Series inductors L2 and L3 constituted of wiring pattern 207, parallel capacitor C2 constituted of wiring pattern 207, and capacitor C3 constituted of open stub 208 are connected to inductor L1.

That is, in semiconductor device 200 of the second exemplary embodiment, the circuit constructed with inductor L1 and capacitor C1 is added so as to act as the LC high-pass matching circuit.

Therefore, in semiconductor device 200 of the second exemplary embodiment, similarly to semiconductor device 100 of the first exemplary embodiment, because the LC high-pass matching circuit that generates the parallel resonance at the operating frequency is added to Cds of the GaN HFET on semiconductor chip 201, Cds is decreased to improve the high-frequency characteristic.

Therefore, the effect similar to that of semiconductor device 100 of the first exemplary embodiment is obtained in semiconductor device 200 of the second exemplary embodiment.

When the wire length and the wiring pattern size are fixed such that the inductance and the capacitance are similarly obtained with respect to the gate-source capacitance, the inductance and the capacitance generate the parallel resonance at the operating frequency, and Cgs is decreased to improve the frequency characteristic.

The characteristic of semiconductor device 200 of the second exemplary embodiment will be described below using a comparative example. Specifically, a difference in characteristic between semiconductor device 200 of the second exemplary embodiment and a semiconductor device of the comparative example that does not include LC high-pass matching circuit constructed with inductor L1 and capacitor C1 will be described below for the case (Example 1) that the stub wiring has a length of 450 μm and the case (Example 2) that the stub wiring has a length of 250 μm.

Example 2-1

For Stub Wiring 205 Having a Length of 450 μm

Figure 12:
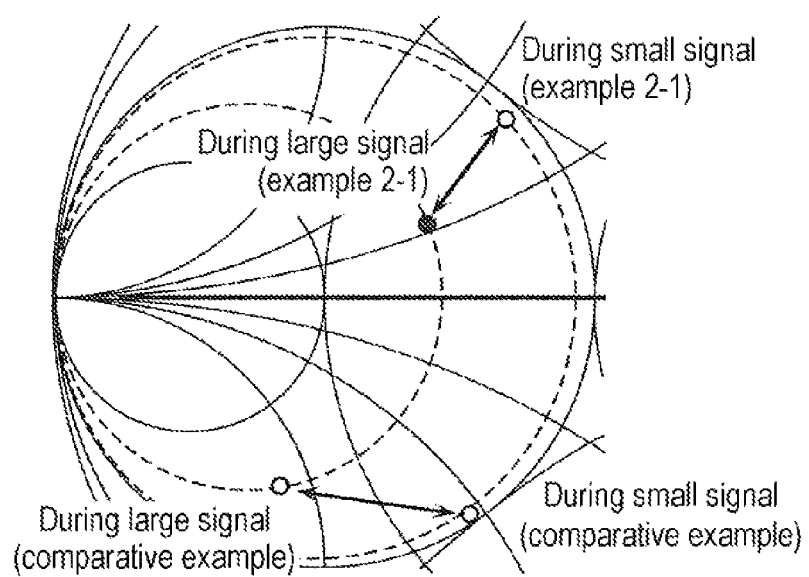
FIG. 12 is a Smith chart illustrating a difference in characteristic according to Example 2-1 between the semiconductor device of the second exemplary embodiment and a semiconductor device of a comparative example.

FIG. 12 is a Smith chart illustrating the impedance during the small signal and the impedance during the large signal in semiconductor device 200 of Example 2-1 in which stub wiring 205 has a length of 450 μm and the semiconductor device of the comparative example that does not include the high-pass matching circuit.

FIG. 12 illustrates mismatch degrees of the impedance during the small signal and the impedance during the large signal in the semiconductor device of the comparative example and the semiconductor device of Example 2-1.

At this point, the impedance corresponds to the impedance of the unit cell having a gate width of 450 μm. That is, the impedance of a total gate width of 2.7 mm corresponds to the value in which the impedance of gate width 450 μm is parallelized.

Using the return loss (rl) introduced in the first exemplary embodiment, the return losses of the cases (1) and (2) are calculated and compared.

(1) The calculation of the return loss of the impedance during the large signal of the semiconductor device of the comparative example based on the impedance during the small signal of the semiconductor device of the comparative example (2) The calculation of the return loss of the impedance during the large signal of semiconductor device 200 of Example 2-1 based on the impedance during the small signal of semiconductor device 200 of Example 2-1

At this point, the output impedance during the small signal of the semiconductor device of the comparative example is 24.8−j·24.5 (Ω), and the output impedance during the large signal is 9.9−j·4.2 (Ω). The output impedance during the small signal of semiconductor device 200 of Example 2-1 is 47.8+j·1.3 (Ω), and the output impedance during the large signal is 28.7−j·5.6 (Ω).

(1) The semiconductor device of the comparative example has a return loss of 9.2 dB, and (2) semiconductor device 200 of Example 2-1 has a return loss of 11.5 dB.

It is found that semiconductor device 200 of Example 2-1 is smaller than the semiconductor device of the comparative example in the difference between the impedance during the large output operation and the impedance during the small output operation of the device and the mismatch degree. The small difference between the impedance during the large output operation and the impedance during the small output operation of the device means that the linear gain is hardly decreased during the large signal matching. Therefore, in semiconductor device 200 of Example 2-1, the decrease in linear gain during large signal matching can be suppressed by applying the LC high-pass matching circuit.

In semiconductor device 200 of Example 2-1, compared with the semiconductor device of a comparative example regarding both the return loss and the loss characteristic during the 50-ohm matching, the wideband can be achieved in view of the matching and the loss characteristic.

Example 2-2

For Stub Wiring 205 Having a Length of 250 μm

Figure 13:
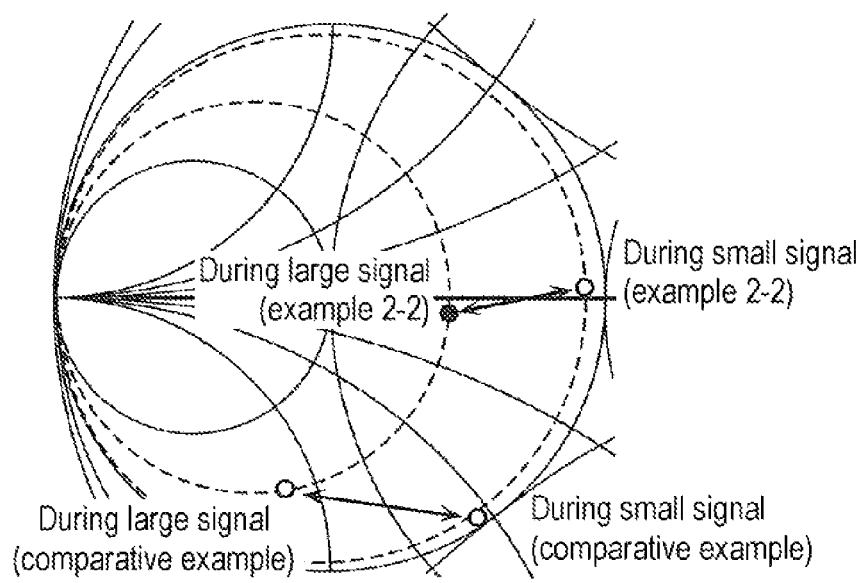
FIG. 13 is a Smith chart illustrating a difference in characteristic according to Example 2-2 between the semiconductor device of the second exemplary embodiment and the semiconductor device of the comparative example.

FIG. 13 is a Smith chart illustrating the impedance during the small signal and the impedance during the large signal in semiconductor device 200 of Example 2-2 in which stub wiring 205 has a length of 250 μm and the semiconductor device of the comparative example that does not include the high-pass matching circuit.

As can be seen from FIG. 13, even if stub wiring 205 is shorter than that of Example 2-1, (1) the semiconductor device of the comparative example has a return loss of 9.2 dB, and (2) the semiconductor device of the second exemplary embodiment has a return loss of 12.4 dB.

That is, in semiconductor device 200 in which stub wiring 205 has a length of 250 μm, similarly to Example 2-1 in which stub wiring 205 has a length of 450 μm, it is found that the difference between the impedance during the large output operation and the impedance during the small output operation of the device and the mismatch degree are improved compared with the semiconductor device of the comparative example.

As described above, semiconductor device 200 of the second exemplary embodiment includes the GaN HFET that is formed on the silicon substrate, capacitor 206 that is formed on the substrate and provided adjacent to the GaN HFET, and stub wiring 205 that is formed on the silicon substrate to electrically connect one of electrodes of capacitor 206 and the output terminal of the GaN HFET. The other electrode of capacitor 206 is grounded, and stub wiring 205 and capacitor 206 constitute the LC high-pass matching circuit that passes the signal having the operating frequency or more.

The silicon substrate, the GaN HFET, and the LC high-pass matching circuit correspond to the substrate, the active element, and the high-pass matching circuit, respectively.

Therefore, in semiconductor device 200 of the second exemplary embodiment, similarly to semiconductor device 100 of the first exemplary embodiment, because the LC high-pass matching circuit that generates the parallel resonance at the operating frequency is added to Cds of the GaN HFET, Cds is decreased to improve the high-frequency characteristic.

In FIG. 10, stub wiring 205 is linearly arranged. Alternatively, stub wiring 205 may be bent when being large in length.

In the second exemplary embodiment, leading-end short-circuit stub-forming stub wiring 205 (short stub-forming stub wiring) is electrically connected to the leading end of drain extraction wiring 204 of semiconductor chip 201 while branched in the longitudinal direction of the GaN HFET. Alternatively, the similar effect can be obtained even if stub wiring 205 is not branched with respect to drain extraction wiring 204, but electrically connected only in one direction. That is, one stub wiring may be connected to the leading end of drain extraction wiring 204.

Third Exemplary Embodiment

A semiconductor device according to a third exemplary embodiment is substantially identical to semiconductor device 100 of the first exemplary embodiment, and the semiconductor device of the third exemplary embodiment differs from semiconductor device 100 of the first exemplary embodiment in that the semiconductor device of the third exemplary embodiment includes a diode and an application terminal used to apply the bias voltage to one of the anode and cathode of the diode, and that one of the anode and cathode of the diode is electrically connected to one of electrodes of capacitor 111 while the other of the anode and cathode of the diode is grounded.

Figure 14:
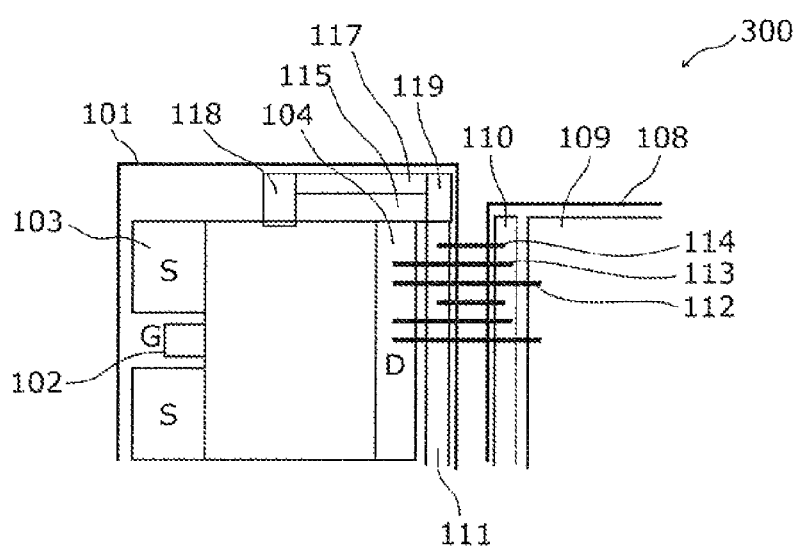
FIG. 14 is a plan view illustrating a configuration of a semiconductor device according to a third exemplary embodiment.
Figure 15:
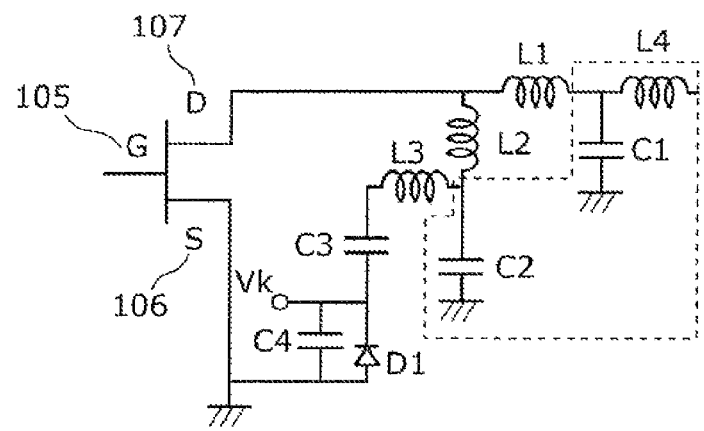
FIG. 15 is an equivalent circuit diagram of the semiconductor device of the third exemplary embodiment.

FIG. 14 is a plan view illustrating a configuration of the semiconductor device according to the third exemplary embodiment, and FIG. 15 is an equivalent circuit diagram of the semiconductor device of the third exemplary embodiment.

In mobile communication devices such as a mobile phone, the wideband and multiband are achieved in order to deal with high-speed, large-capacity communication. Therefore, in a transmission power amplifier used in the mobile communication device, there is a need for the operation in the wideband.

Therefore, in semiconductor device 300 of the third exemplary embodiment, diode 115 is added to the circuit of semiconductor device 100 of the first exemplary embodiment, and the optimum output impedance is obtained by changing a voltage applied to diode 115 such that the difference between the impedance during the large output operation and the impedance during the small output operation is decreased at each frequency. That is, the gain is brought close to the gain during the small signal operation as much as possible while the maximum output power and efficiency are obtained during the large signal operation.

The configuration and effect of semiconductor device 300 of the third exemplary embodiment will specifically be described below with reference to the drawings.

In semiconductor device 300 of the third exemplary embodiment, compared with the configuration in FIGS. 1A and 1B, 2, and 3 of semiconductor device 100 of the first exemplary embodiment, as illustrated in FIG. 14, capacitor 117 is formed in parallel to diode 115, and bias applying pad 119 is provided. Bias applying pad 119 is a terminal that varies the voltage applied to diode 115. Diode 115 and capacitor 117 are electrically connected to the ground potential through grounding wiring 118.

Specifically, as illustrated by an equivalent circuit in FIG. 15, diode D1 and capacitor C4 correspond to diode 115 and capacitor 117 in FIG. 14, respectively. A variable voltage is applied to the cathode terminal of diode D1, and the anode terminal of diode D1 is electrically connected to the ground potential.

That is, in semiconductor device 300 of the third exemplary embodiment, the circuit constructed with inductor L2 and capacitor C2, the circuit constructed with inductor L3 and capacitor C3, and the circuit constructed with diode D1 and capacitor C4 are added to LC low-pass circuit, which is constructed with series inductors L1 and L4 and parallel capacitor C1, so as to act as the LC high-pass matching circuit.

The application of capacitor C4 depends on the capacitance value of diode D1. Necessity of capacitor C4 is eliminated when the capacitance value of diode D1 is greater than or equal to a desired value.

At this point, a pn-junction diode, in which a p-type AlGaN layer used in a gate portion of a GaN GIT (Gate Injection Transistor) is used, is applied to diode 115. The gate electrode of the GaN HFET is used as an anode terminal electrode, and the drain electrode and the source electrode are used as a cathode terminal electrode. GaN has the wide band gap (3.39 eV), and has the following features as the transistor and the diode compared with GaAs. That is, (1) high withstand voltage characteristic, (2) high-temperature operation, (3) high surge voltage resistance, (4) high power handling, and (5) low-distortion characteristic (low intermodulation distortion).

Thus, the GaN HFET is suitable for the circuit element, in which a high power handling capability is required to deal with large power, as a high-breakdown-voltage, high-frequency device that can be operated with the high output.

In the case that grounding wiring 118 is connected to the source terminal of the GaN HFET, the through-hole is made in the silicon substrate of semiconductor chip 101, and a via hole is made by metalizing the inside of the through-hole to be able to perform the electric connection of diode 115 and capacitor 117 to the ground electrode.

The configuration of diode 115 is not limited to the above configuration. For example, a pin-junction diode and a Schottky barrier diode in which a Schottky junction of the GaN HFET is used may be used.

In the configuration in FIGS. 14 and 15, the same configuration as that in FIGS. 1A and 1B, 2, and 3 is designated by the same reference mark.

In the configuration, the value of the reactance component indicated by (equation 1) can be varied by adjusting the bias voltage applied to diode D1 according to the operating frequency of the GaN HFET. That is, diode D1 acts as a variable reactance element.

In semiconductor device 300 of the third exemplary embodiment, at the low operating frequency, it is necessary to decrease the capacitance value of diode D1 to decrease the series capacitance of capacitor C3 and diode D1. Therefore, the bias of cathode terminal voltage Vk is set in a reverse bias direction (for example, 15 V). That is, diode D1 functions so as to decrease the reactance component (X>0) at a low operating frequency.

On the other hand, during the high operating frequency, it is necessary to increase the capacitance value of diode D1 to increase the series capacitance of capacitor C3 and diode D1. Therefore, the bias of cathode terminal voltage Vk is set to a zero bias. That is, diode D1 functions so as to decrease the reactance component (X>0) at a high operating frequency.

The characteristic of semiconductor device 300 of the third exemplary embodiment will be described below using a comparative example. Specifically, a difference in characteristic between semiconductor device 300 of the third exemplary embodiment including the LC high-pass matching circuit constructed with inductors L2 and L3, capacitors C2, C3, and C4, and diode D1 and a semiconductor device of the comparative example that does not include the LC high-pass matching circuit will be described below.

Figure 16:
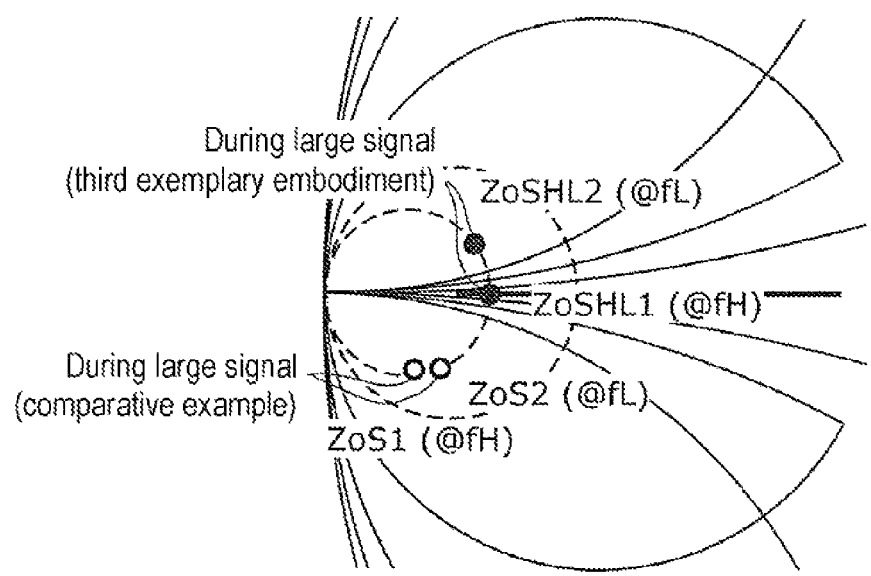
FIG. 16 is a Smith chart illustrating output-impedance frequency characteristics of the semiconductor device of the third exemplary embodiment and a semiconductor device of a comparative example.

FIG. 16 is a Smith chart illustrating the frequency characteristic of the output impedance during the large signal in semiconductor device 300 of the third exemplary embodiment and the semiconductor device of the comparative example.

As illustrated in FIG. 25, the output side of the transistor is expressed by the parallel circuit of the drain-source resistance (Rds) and the drain-source capacitance (Cds).

In the comparative example, as illustrated in FIG. 16, the frequency characteristic of the output impedance becomes ZoS1 (ZoS1 (@fH) in FIG. 16) at a high frequency, and becomes ZoS2 (ZoS2 (@fL) in FIG. 16) at a low frequency. That is, the impedance reflecting the frequency characteristic of the drain-source capacitance (Cds) is obtained.

On the other hand, in semiconductor device 300 of the third exemplary embodiment, diode D1 functions so as to decrease the reactance component (X>0) at the low operating frequency, and diode D1 functions so as to increase the reactance component (X>0) at the high operating frequency, so that the output impedance can be converted.

Specifically, at a frequency of 1.6 GHz that is of a low operating frequency in a operating frequency band, the output impedance of semiconductor device 300 is converted into an output impedance position of ZoSHL2 (ZoSHL2 (@fL) in FIG. 16).

On the other hand, at a frequency of 2.1 GHz that is of a high operating frequency in the operating frequency band, the output impedance of semiconductor device 300 is converted into an output impedance position of ZoSHL1 (ZoSHL1 (@fH) in FIG. 16).

Although only the output impedance during the large signal is illustrated in FIG. 16, the impedance conversion performed by the LC high-pass matching circuit exhibits a similar tendency during the small signal.

Semiconductor device 300 of the third exemplary embodiment can be operated in the wideband by setting cathode voltage Vk of diode D1 according to the operating frequency.

That is, the output side of the transistor is expressed by the parallel circuit of the drain-source resistance (Rds) and the drain-source capacitance (Cds). Therefore, as illustrated in FIG. 16, the frequency characteristic of the output impedance becomes ZoS1 (ZoS1 (@fH) in FIG. 16) at the high frequency, and becomes ZoS2 (ZoS2 (@fL) in FIG. 16) at the low frequency. That is, the impedance reflecting the frequency characteristic of the drain-source capacitance (Cds) is obtained. When diode D1 and capacitor C4 are added, the output impedance is converted into ZoSHL1 (ZoSHL1 (@fH) in FIG. 16) at the high frequency, and the output impedance is converted into ZoSHL2 (ZoSHL2 (@fL) in FIG. 16) at the low frequency.

Therefore, semiconductor device 300 of the third exemplary embodiment can be operated in the wideband.

The desired frequency is set in the frequency band by setting cathode terminal voltage Vk based on dependence of the capacitance value of diode D1 on cathode terminal voltage Vk. Specifically, because the capacitance value of diode D1 corresponds to cathode terminal voltage Vk on a one-to-one basis, the output impedance is set to a value corresponding to the desired frequency in the range from ZoSHL2 to ZoSHL1.

Figure 17A:
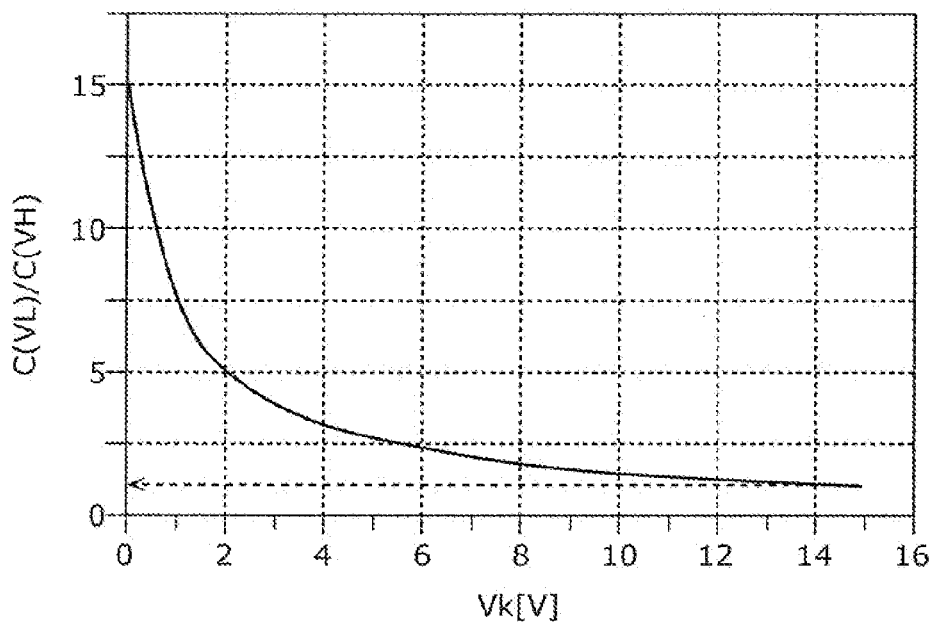
FIG. 17A is a graph illustrating a capacity-voltage characteristic of a diode.

FIG. 17A is a graph illustrating dependence of a ratio of the capacitance value at low voltage VL of diode D1 to the capacitance value at high voltage VH (vertical axis) on cathode terminal voltage Vk (horizontal axis). Low voltage VL is near 1 V, and high voltage VH is at 15 V.

The capacitance of diode D1 can be adjusted by adjusting cathode terminal voltage Vk. Specifically, the bias voltage of diode D1 is adjusted by adjusting cathode terminal voltage Vk. That is, the spread of the depletion layer generated in diode D1 can be adjusted by adjusting cathode terminal voltage Vk, and therefore the capacitance of diode D1 can be adjusted.

Figure 17B:
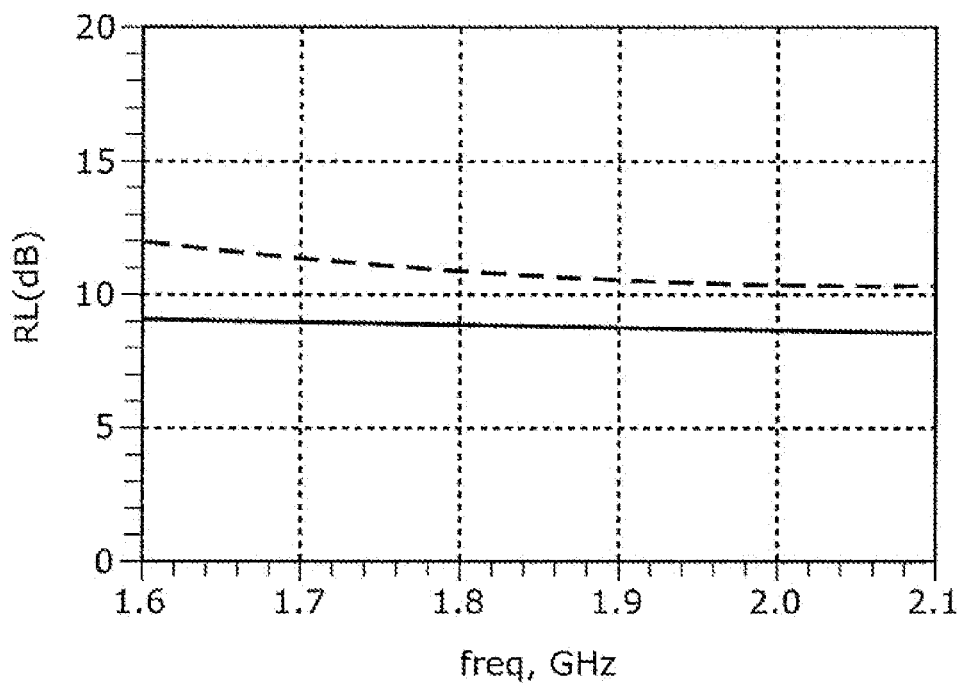
FIG. 17B is a graph illustrating a difference in frequency characteristic of a loss between the semiconductor device of the third exemplary embodiment and a semiconductor device of a comparative example.

FIG. 17B is a graph illustrating the return loss (solid line) of the impedance during the large signal based on the impedance during the small signal of the semiconductor device of the comparative example and the return loss (broken line) of the impedance during the large signal based on the impedance during the small signal of semiconductor device 300 of the third exemplary embodiment.

The return losses in the cases (1) and (2) are calculated and compared.

(1) The calculation of the return loss of the impedance during the large signal of the semiconductor device of the comparative example based on the impedance during the small signal of the semiconductor device of the comparative example (2) The calculation of the return loss of the impedance during the large signal of semiconductor device 300 of the third exemplary embodiment based on the impedance during the small signal of semiconductor device 300 of the third exemplary embodiment As a result, at a frequency of 1.6 GHz, (1) the semiconductor device of the comparative example has a return loss of 9.0 dB, and (2) semiconductor device 300 of the third exemplary embodiment has a return loss of 12.0 dB. At a frequency of 2.15 GHz, (1) the semiconductor device of the comparative example has a return loss of 8.8 dB, and (2) semiconductor device 300 of the third exemplary embodiment has a return loss of 10.3 dB.

In semiconductor device 300 of the third exemplary embodiment, it is found that the mismatch degree is improved at both ends of the band.

Semiconductor device 300 of the third exemplary embodiment has L2 of 135 pH, C2 of 0.88 pF, L3 of 130 pH, C3 of 360 pF, and C4 of 30 pF.

The lower-limit frequency and the upper-limit frequency in the frequency band can be changed by selecting parameter values of L2, C2, L3, and C3.

As described above, compared with semiconductor device 100 of the first exemplary embodiment, semiconductor device 300 of the third exemplary embodiment further includes diode 115 and the application terminal used to apply cathode terminal voltage Vk to the cathode of diode 115. The cathode of diode 115 is electrically connected to one of the electrodes of capacitor 111, and the anode of diode 115 is grounded. The application terminal used to apply cathode terminal voltage Vk is bias applying pad 119 that is of a metal electrode formed in semiconductor chip 101.

In the case that semiconductor device 300 of the third exemplary embodiment is applied to the power amplifier used in the mobile communication device set such as the mobile phone, the LC high-pass matching circuit is added to change cathode terminal voltage Vk, which allows the wideband operation to be performed with as high gain as possible during the large signal operation.

In other words, the capacitance of diode D1 can be adjusted by adjusting cathode terminal voltage Vk. Specifically, the bias voltage of diode D1 is adjusted by adjusting cathode terminal voltage Vk. That is, the spread of the depletion layer generated in diode D1 can be adjusted by adjusting cathode terminal voltage Vk, and therefore the capacitance of diode D1 can be adjusted. Therefore, in semiconductor device 300 of the third exemplary embodiment, cathode terminal voltage Vk is properly adjusted according to the operating frequency, which allows the characteristic of the LC high-pass matching circuit to be properly adjusted according to the operating frequency. As a result, the decrease in linear gain can be suppressed even if semiconductor device 300 is operated in the wideband.

The configuration of semiconductor device 300 of the third exemplary embodiment can also be applied to semiconductor device 200 of the second exemplary embodiment.

In the configuration of semiconductor device 300, a control voltage is applied to the cathode terminal, the anode terminal is connected to the ground potential, and a positive control voltage is applied to the cathode terminal. In the case that the cathode terminal and the anode terminal are replaced with each other such that the cathode terminal serves as the ground potential, the configuration of semiconductor device 300 can also be applied to semiconductor device 200 by applying the negative control voltage to the anode terminal.

Modification of Third Exemplary Embodiment

A semiconductor device according to a modification of the third exemplary embodiment differs from semiconductor device 300 of the third exemplary embodiment only in that capacitor 117 is provided in series with diode D1.

Figure 18:
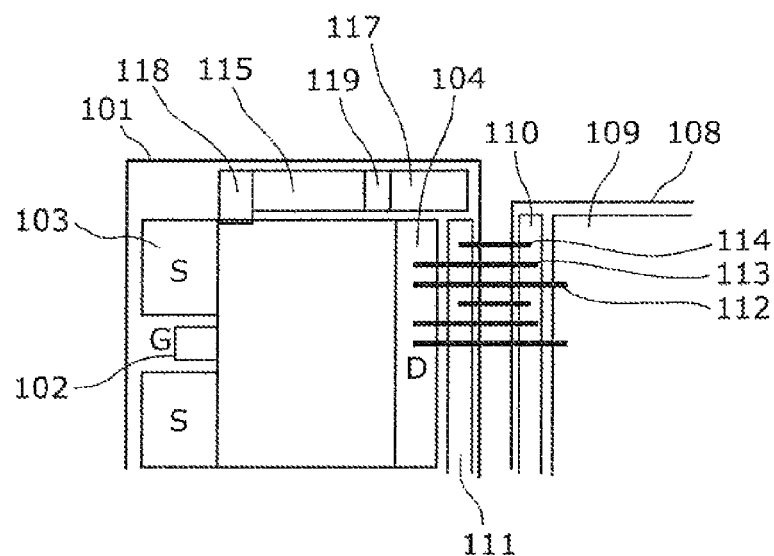
FIG. 18 is a plan view illustrating a configuration of a semiconductor device according to a modification of the third exemplary embodiment.
Figure 19:
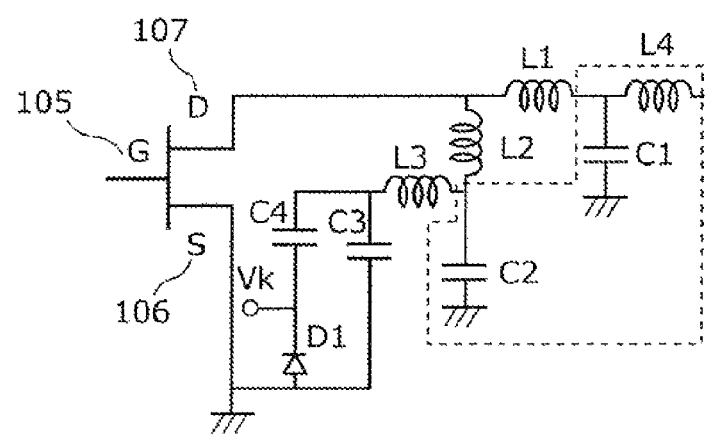
FIG. 19 is an equivalent circuit diagram of the semiconductor device of the modification.

FIG. 18 is a plan view illustrating a configuration of the semiconductor device of the modification, and FIG. 19 is an equivalent circuit diagram of the semiconductor device of the modification.

As illustrated in FIG. 18, capacitor 117 is formed in series with diode 115, and bias applying pad 119 that is of a terminal varying the voltage applied to diode 115 is provided between diode 115 and capacitor 117. Diode 115 is electrically connected to the ground potential through grounding wiring 118.

Specifically, as illustrated by the equivalent circuit in FIG. 19, diode D1 and capacitor C4 correspond to diode 115 and capacitor 117 in FIG. 18, respectively. A variable voltage is applied to the cathode terminal of diode D1, and the anode terminal of diode D1 is electrically connected to the ground potential.

In the semiconductor device of the modification, at the low operating frequency, it is necessary to decrease the capacitance value of diode D1 to decrease the series capacitance of capacitor C3 and diode D1. Therefore, the bias of cathode terminal voltage Vk is set in a reverse bias direction (for example, 15 V). That is, diode D1 functions so as to decrease the reactance component (X>0) at a low operating frequency.

On the other hand, during the high operating frequency, it is necessary to increase the capacitance value of diode D1 to increase the series capacitance of capacitor C3 and diode D1. Therefore, the bias of cathode terminal voltage Vk is set to a zero bias. That is, diode D1 functions so as to increase the reactance component (X>0) at a high operating frequency.

The characteristic of semiconductor device 300 of the third exemplary embodiment will be described below using a comparative example. Specifically, a difference in characteristic between the semiconductor device of the modification including the LC high-pass matching circuit constructed with inductors L2 and L3, capacitors C2, C3, and C4, and diode D1 and a semiconductor device of the comparative example that does not include the LC high-pass matching circuit will be described below.

Figure 20A:
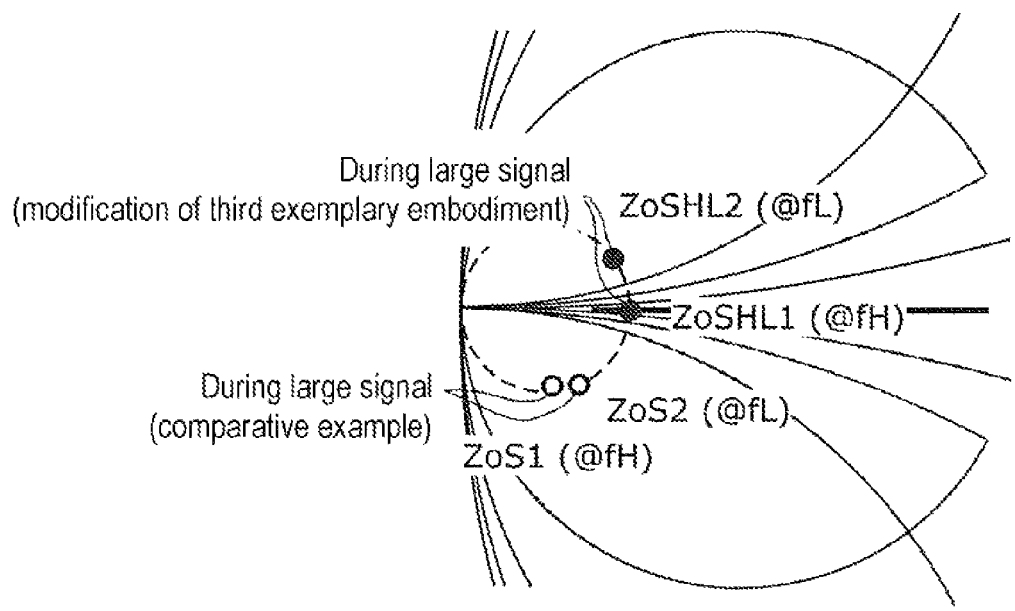
FIG. 20A is a Smith chart illustrating output-impedance frequency characteristics of the semiconductor device of the modification and a semiconductor device of a comparative example.

FIG. 20A is a Smith chart illustrating the frequency characteristic of the output impedance during the large signal in the semiconductor device of the modification and the semiconductor device of the comparative example.

In the comparative example, as in the case of that in the third exemplary embodiment, the frequency characteristic of the output impedance becomes ZoS1 (ZoS1 (@fH) in FIG. 20A) at the high frequency, and becomes ZoS2 (ZoS2 (@fL) in FIG. 20A) at the low frequency. That is, the impedance reflecting the frequency characteristic of the drain-source capacitance (Cds) is obtained.

On the other hand, in the semiconductor device of the modification, diode D1 functions so as to decrease the reactance component (X>0) at the low operating frequency, and diode D1 functions so as to increase the reactance component (X>0) at the high operating frequency, so that the output impedance can be converted.

Specifically, at a frequency of 1.6 GHz that is of the low operating frequency in the operating frequency band, the output impedance of the semiconductor device of the modification is converted into the output impedance position of ZoSHL2 (ZoSHL2 (@fL) in FIG. 20A).

On the other hand, at a frequency of 2.1 GHz that is of a high operating frequency in the operating frequency band, the output impedance of the semiconductor device of the modification is converted into an output impedance position of ZoSHL1 (ZoSHL1 (@fH) in FIG. 20A).

Similarly to semiconductor device 300 of the third exemplary embodiment, the semiconductor device of the modification can be operated in the wideband by setting cathode voltage Vk of diode D1 according to the operating frequency.

The desired frequency is set in the frequency band by setting cathode terminal voltage Vk based on dependence of the capacitance value of diode D1 on cathode terminal voltage Vk. Specifically, because the capacitance value of diode D1 corresponds to cathode terminal voltage Vk on a one-to-one basis, the output impedance is set to a value corresponding to the desired frequency in the range from ZoSHL2 to ZoSHL1.

Figure 20B:
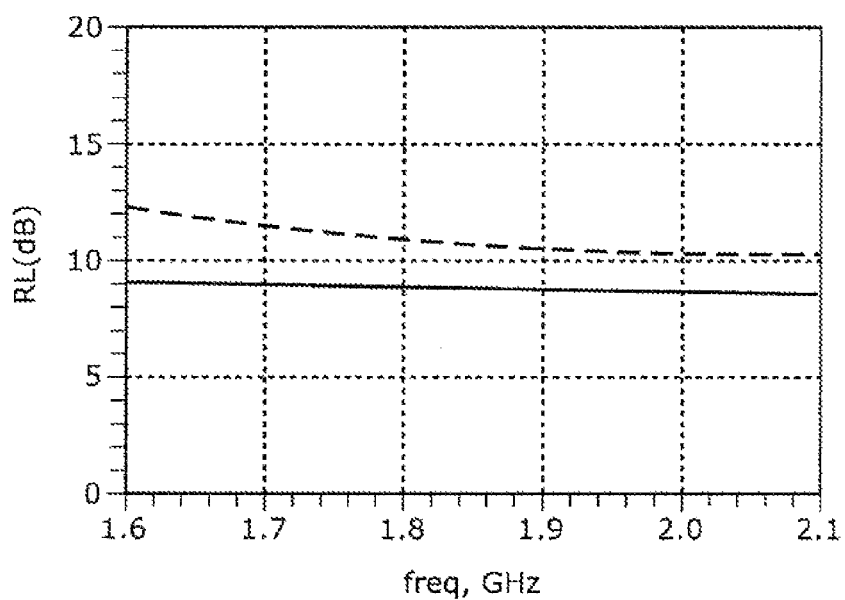
FIG. 20B is a graph illustrating a difference in frequency characteristic of a loss between the semiconductor device of the modification and a semiconductor device of a comparative example.

FIG. 20B is a graph illustrating the return loss (solid line) of the impedance during the large signal based on the impedance during the small signal of semiconductor device of the comparative example and the return loss (broken line) of the impedance during the large signal based on the impedance during the small signal of the semiconductor device of the modification.

The return losses in the cases (1) and (2) are calculated and compared.

(1) The calculation of the return loss of the impedance during the large signal of the semiconductor device of the comparative example based on the impedance during the small signal of the semiconductor device of the comparative example (2) The calculation of the return loss of the impedance during the large signal of the semiconductor device of the modification based on the impedance during the small signal of the semiconductor device of the modification As a result, at a frequency of 1.6 GHz, (1) the semiconductor device of the comparative example has a return loss of 9.1 dB, and (2) the semiconductor device of the modification has a return loss of 12.4 dB. At a frequency of 2.15 GHz, (1) semiconductor device 100 of the first exemplary embodiment has a return loss of 8.8 dB, and (2) the semiconductor device of the modification has a return loss of 10.2 dB.

In the semiconductor device of the modification, similarly to semiconductor device 300 of the third exemplary embodiment, it is found that the mismatch degree is improved at both ends of the band.

The semiconductor device of the modification has L2 of 135 pH, C2 of 0.88 pF, L3 of 110 pH, C3 of 30 pF, and C4 of 330 pF.

The lower-limit frequency and the upper-limit frequency in the frequency band can be changed by selecting parameter values of L2, C2, L3, and C3.

As described above, the semiconductor device of the modification differs from semiconductor device 300 of the third exemplary embodiment only in that capacitor 117 is provided in series with diode D1.

In the power amplifier used in the mobile communication device set such as the mobile phone, the LC high-pass matching circuit is added to change the voltage applied to cathode terminal voltage Vk, which allows the wideband operation to be performed with as high gain as possible during the large signal operation.

In other words, in the semiconductor device of the modification, similarly to semiconductor device 300 of the third exemplary embodiment, the capacitance of diode D1 can be adjusted by adjusting cathode terminal voltage Vk. In the semiconductor device of the modification, similarly to semiconductor device 300 of the third exemplary embodiment, the decrease in linear gain can be suppressed by adjusting cathode terminal voltage Vk according to the operating frequency even if the semiconductor device of the modification is operated in the wideband.

The configuration of semiconductor device 300 of the third exemplary embodiment can also be applied to semiconductor device 200 of the second exemplary embodiment.

In the configuration of semiconductor device 300, a control voltage is applied to the cathode terminal, the anode terminal is connected to the ground potential, and a positive control voltage is applied to the cathode terminal. In the case that the cathode terminal and the anode terminal are replaced with each other such that the cathode terminal serves as the ground potential, the configuration of semiconductor device 300 can also be applied to semiconductor device 200 by applying the negative control voltage to the anode terminal.

Fourth Exemplary Embodiment

A semiconductor device according to a fourth exemplary embodiment differs from semiconductor device 300 of the third exemplary embodiment in that the semiconductor device of the fourth exemplary embodiment includes a detector circuit that detects the output power of semiconductor chip 101 and a bias voltage generator that generates cathode terminal voltage Vk based on a detection result of the detector circuit to apply cathode terminal voltage Vk to bias applying pad 119.

Figure 21:
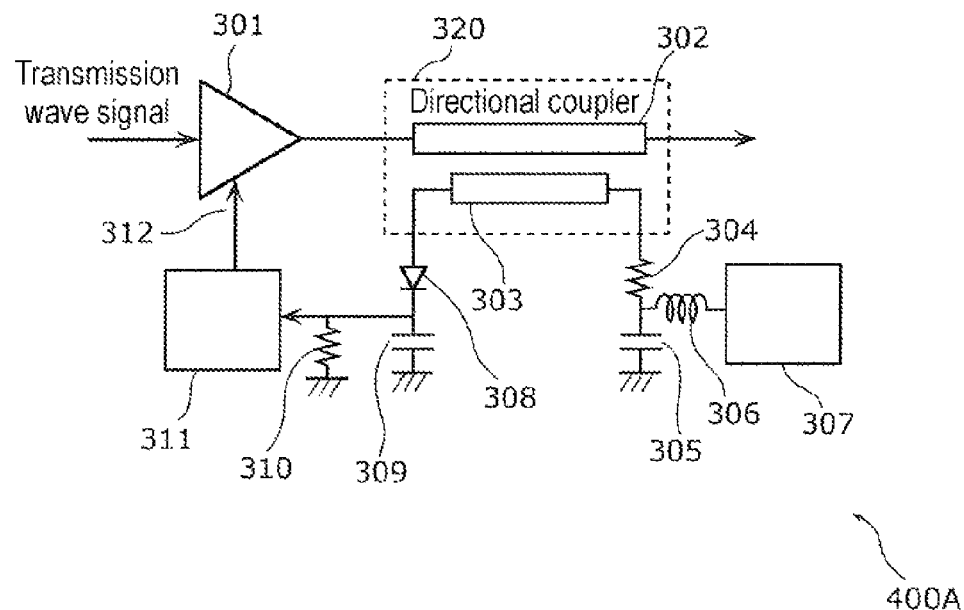
FIG. 21 is a circuit diagram illustrating a configuration of a semiconductor device according to a fourth exemplary embodiment.

FIG. 21 is a circuit diagram illustrating a configuration of the semiconductor device of the fourth exemplary embodiment including the output power detector circuit.

In the mobile communication device such as the mobile phone, the kind of modulation for the high-frequency output signal is selected according to the amount of information to be transmitted (transmission rate). An output-level operating point of the transmission power amplifier depends on the kind of the modulation. For the previous analog high-frequency signal, the transmission power amplifier can be operated at a saturated output level at which the efficiency is substantially maximized. On the other hand, nowadays there is a demand to obtain the low-distortion characteristic because a digital high-frequency modulated signal is mainly dealt with. For this reason, it is necessary that the power amplifier be controlled so as to be operated at the good-linearity output level at which back-off is performed from the saturated output point. The back-off level depends on the kind of the modulation.

As described above, during the large signal operation, the optimum output impedance shifts to the low impedance due to the decrease in Rds and the increase in Cds. Therefore, the optimum output impedance varies according to the output level of the power amplifier.

The semiconductor device of the fourth exemplary embodiment can be adjusted such that the difference between the impedance during the large output operation and the impedance during the small output operation is decreased at the desired output level of the power amplifier by applying the configuration of the third exemplary embodiment in which the diode is loaded.

Specifically, semiconductor device 400A of the fourth exemplary embodiment includes the power amplifier, namely, the GaN HFET, the detector circuit that detects the output level of the high-frequency output signal from the power amplifier, a control signal unit that generates the bias voltage to be applied to diode D1 based on the output value of the detector circuit, and a mechanism for bias-application to diode D1 with a control signal generated by the control signal unit. That is, the control signal corresponds to cathode terminal voltage Vk of the third exemplary embodiment.

In the configuration of semiconductor device 400A, the value of the reactance component indicated by (equation 1) can be varied by adjusting the bias voltage applied to diode D1 according to the output level of the high-frequency output signal of the GaN HFET.

In semiconductor device 400A of the fourth exemplary embodiment in FIG. 21, a transmission wave signal is provided to the input side of power amplifier 301, and the output of power amplifier 301 is transmitted through main line 302 of directional coupler 320. One of terminals of sub-line 303 that constitutes directional coupler 320 together with main line 302 is connected to one of terminals of resistance element 304. The other terminal of resistance element 304 is grounded through capacitor 305, and connected to the output of bias circuit 307 through inductor 306.

The other terminal of sub-line 303 is connected to the anode terminal of diode 308, the cathode terminal of diode 308 is grounded through capacitor 309 and resistance element 310 that are connected in parallel, and the cathode terminal of diode 308 is connected to control terminal 312 of power amplifier 301 through controller 311.

Power amplifier 301 is in the state in which semiconductor device 300 of the third exemplary embodiment is mounted on a ceramic package or the like. A terminal (hereinafter, referred to as a control voltage applying terminal) used to apply cathode terminal voltage Vk to the cathode terminal of diode D1 of the third exemplary embodiment is provided in the package in addition to the input terminal and output terminal for the high-frequency signal. Control terminal 312 is connected to the control voltage applying terminal, and is electrically connected to the cathode terminal of diode D1 through bias applying pad 119. Power amplifier 301 is constructed with the elements (such as the GaN HFET, inductors L1 to L4, capacitors C1 to C4, and diode D1) included in semiconductor device 300 of the third exemplary embodiment.

Bias circuit 307 sets the operating point of diode 308 to forward voltage Vf or less.

Sub-line 303 is roughly coupled to main line 302, and a monitor signal that is obtained as a part of the transmission wave signal is input to diode 308 through main line 302.

Using capacitor 309 and resistance element 310, diode 308 rectifies the monitor signal at the operating point to extract an envelope component of the monitor signal. Capacitor 309 and resistance element 310 act as a smoothing circuit. An instantaneous value of the envelope component corresponds to power (amplitude) of the monitor signal.

For example, controller 311 updates the voltage applied to the cathode terminal of diode D1 of power amplifier 301 to a value in which excess or deficiency (a deviation from a prescribed target value) of the power of the monitor signal is corrected in a period of one millisecond (=1/(1000 hertz)) or less.

Controller 311 stores input/output characteristic data of the GaN HFET at each operating frequency and data of the voltage applied to diode D1 at each point of the input/output characteristic in a memory. The data is acquired by previously performing calibration.

As described above, semiconductor device 400A of the fourth exemplary embodiment includes directional coupler 320 that detects the output power of power amplifier 301 and controller 311 that generates cathode terminal voltage Vk based on the detection result of directional coupler 320 to apply cathode terminal voltage Vk to bias applying pad 119. Directional coupler 320 and controller 311 correspond to the detector circuit and the bias voltage generator, respectively.

Therefore, semiconductor device 400A of the fourth exemplary embodiment can be operated at the good-linearity output level at which the back-off is performed from the saturated output point. Because the back-off level can be set by controller 311 at any value, the low-distortion characteristic can be obtained in any modulation system by properly setting the back-off level according to the digital modulation system. Semiconductor device 400A is useful for a high-output, high-gain microwave-band power amplifier.

Modification of Fourth Exemplary Embodiment

A semiconductor device according to a modification of the fourth exemplary embodiment differs from semiconductor device 400A of the fourth exemplary embodiment in that a detector circuit detects the input power of semiconductor chip 101.

Figure 22:
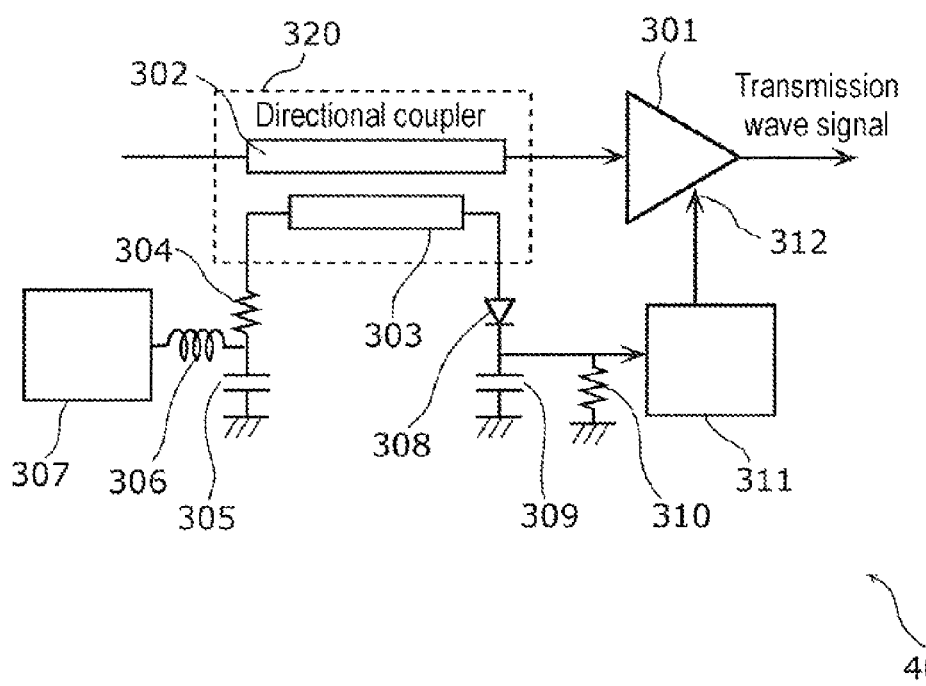
FIG. 22 is a circuit diagram illustrating a configuration of a semiconductor device according to a modification of the fourth exemplary embodiment.

FIG. 22 is a circuit diagram illustrating a configuration of the semiconductor device of the modification of the fourth exemplary embodiment including the input power detector circuit.

As illustrated in FIG. 22, in semiconductor device 400B of the modification, the configuration of the semiconductor device including the output power detector circuit of the fourth exemplary embodiment in FIG. 21 is provided on the input side of power amplifier 301. In the configuration of semiconductor device 400B, the value of the reactance component indicated by (equation 1) can be varied by adjusting the bias voltage applied to diode D1 according to the level of the high-frequency input signal input to the GaN HFET.

Semiconductor device 400B of the modification includes directional coupler 320 that detects the input power of power amplifier 301 and controller 311 that generates cathode terminal voltage Vk based on the detection result of directional coupler 320 to apply cathode terminal voltage Vk to bias applying pad 119.

Therefore, in semiconductor device 400B of the modification, the high output and the high gain can be obtained by varying the bias voltage of diode D1 used as the variable reactance element according to the high-frequency input signal level of the GaN HFET. Semiconductor device 400B is useful for the high-output, high-gain microwave-band power amplifier.

The semiconductor device of the present invention is described above based on the exemplary embodiments and the modifications thereof. However, the present invention is not limited to the above exemplary embodiments and the modifications. Various modifications of the exemplary embodiments and modifications or a combination of constituents in the exemplary embodiments and the modifications can be made without departing from the scope of the present invention.

In the first to fourth exemplary embodiments, the LC high-pass matching circuit is constructed with inductor L2 and capacitor C2, or the LC high-pass matching circuit is constructed with inductors L2 and L3 and capacitors C2 and C3. However, the inductor and capacitor of the LC high-pass matching circuit are not limited to the above configurations. The LC high-pass matching circuit may include the two inductors and the one capacitor, or include the one inductor and the two capacitors. Alternatively the LC high-pass matching circuit may include the two inductors and the three capacitors, include the three inductors and the two capacitors, or include at least the three inductors and at least the three capacitors.

In the first to fourth exemplary embodiments, the values of inductors L1 to L3 and capacitors C1 to C3 and the structural parameters of the wiring length are not limited to the above values and structural parameters, but the values and the structural parameters can take optimum values according to the characteristic of the semiconductor device.

The active element formed on the semiconductor chip is not limited to the GaN HFET, but the active element may be made of any group-III nitride semiconductor (such as AlN and AlGaN).

The circuit configurations are illustrated in the above circuit diagrams by way of example, but the present invention is not limited to the circuit configurations. That is, in addition to the above circuit configurations, a circuit that can implement the distinguishing feature of the present invention is also included in the present invention. For example, a circuit configuration in which an element such as a transistor, a resistance element, or a capacitative element is connected in parallel to or series with an element within a range where the functions similar to those of the above-mentioned circuit configurations can be obtained is also included in the present invention. In other words, the term "connected" in the exemplary embodiments is not limited to the case that two terminals (nodes) are directly connected to each other, but includes the case that the two terminals (nodes) are connected to each other through an element within a range where a similar function is obtained.

Additionally, various changes of the exemplary embodiments can be made without departing from the scope of the present invention.

INDUSTRIAL APPLICABILITY

The present invention is useful for the semiconductor device used in the microwave band, particularly for the high-output power amplifier.

REFERENCE MARKS IN THE DRAWINGS 100, 200, 300, 400A, 400B semiconductor device
101, 201 semiconductor chip
102 gate pad
103, 203 source pad
104 drain pad
105 gate terminal
106 source terminal
107 drain terminal
108 dielectric substrate
109, 110, 207, 501, 1101 wiring pattern
111, 117, 206, 305, 309, 505, C1, C2, C3, C4 capacitor
112, 113, 114, 502, 503, 504 bonding wire
115, 308, D1 diode
116 LC high-pass matching circuit
118 grounding wiring
119 bias applying pad
150 region
202 gate extraction wiring 204 drain extraction wiring
205 stub wiring
208 open stub
301 power amplifier
302 main line
303 sub-line
304, 310 resistance element
306, L1, L2, L3, L4 inductor
307 bias circuit
311 controller
312 control terminal
320 directional coupler
801 field effect transistor (FET)
802 circuit
901 transistor chip
904 metal wire
906, 907 pad
908 dielectric chip
910 output strip line
1091 protrusion

What is claimed is:

1. A semiconductor device comprising:
a semiconductor element;
a dielectric substrate adjacent to the semiconductor element; and
first wiring and second wiring that connect the semiconductor element and the dielectric substrate,
wherein the dielectric substrate includes: a first metal layer and a second metal layer formed on a surface of the dielectric substrate; and a ground metal layer formed on a back side of the dielectric substrate,
the semiconductor element includes: an active element; and an output terminal connected to an output end of the active element,
the first metal layer is formed at a position closer to the output terminal of the semiconductor element than the second metal layer,
the first metal layer and the ground metal layer form a first capacitive element,
the second metal layer and the ground metal layer form a second capacitive element,
the output terminal is electrically connected to the first metal layer through the first wiring, and electrically connected to the second metal layer through the second wiring,
the first wiring and the first capacitive element form a high-pass matching circuit that passes a signal with a frequency at an operating frequency or higher
the semiconductor element further includes: a third capacitive element that includes a first electrode and a second electrode; a diode; and an application terminal that applies a bias voltage to one of an anode and a cathode of the diode,
the one of the anode and the cathode of the diode is electrically connected to the second electrode,
the other of the anode and the cathode of the diode is grounded, and
the first electrode is electrically connected to the first wiring.

2. The semiconductor device according to claim 1, wherein the application terminal is a bias applying pad that is of a metal electrode formed in the semiconductor element.

3. The semiconductor device according to claim 2, further comprising:
a detector circuit that detects output power of the semiconductor element; and
a bias voltage generator that generates the bias voltage based on a detection result of the detector circuit to apply the bias voltage to the terminal.

4. The semiconductor device according to claim 3, wherein the active element is made of a group-III nitride semiconductor.

5. The semiconductor device according to claim 2, further comprising:
a detector circuit that detects input power of the semiconductor element; and
a bias voltage generator that generates the bias voltage based on a detection result of the detector circuit to apply the bias voltage to the terminal.

6. The semiconductor device according to claim 5, wherein the active element is made of a group-III nitride semiconductor.

7. The semiconductor device according to claim 2, wherein the active element is made of a group-III nitride semiconductor.

8. The semiconductor device according to claim 1, further comprising:
a detector circuit that detects output power of the semiconductor element; and
a bias voltage generator that generates the bias voltage based on a detection result of the detector circuit to apply the bias voltage to the terminal.

9. The semiconductor device according to claim 8, wherein the active element is made of a group-III nitride semiconductor.

10. The semiconductor device according to claim 1, further comprising:
a detector circuit that detects input power of the semiconductor element; and
a bias voltage generator that generates the bias voltage based on a detection result of the detector circuit to apply the bias voltage to the terminal.

11. The semiconductor device according to claim 10, wherein the active element is made of a group-III nitride semiconductor.

12. The semiconductor device according to claim 1, wherein the active element is made of a group-III nitride semiconductor.

13. A semiconductor device comprising:
a semiconductor element;
a dielectric substrate adjacent to the semiconductor element; and
first wiring and second wiring that connect the semiconductor element and the dielectric substrate,
wherein the dielectric substrate includes: a first metal layer and a second metal layer formed on a surface of the dielectric substrate; and a ground metal layer formed on a back side of the dielectric substrate,
the semiconductor element includes: an active element; and an output terminal connected to an output end of the active element,
the first metal layer is formed at a position closer to the output terminal of the semiconductor element than the second metal layer,
the first metal layer and the ground metal layer form a first capacitive element,
the second metal layer and the ground metal layer form a second capacitive element,
the output terminal is electrically connected to the first metal layer through the first wiring, and electrically connected to the second metal layer through the second wiring, the first wiring and the first capacitive element form a high-pass matching circuit that passes a signal with a frequency at an operating frequency or higher and the semiconductor element further includes a third capacitive element that includes a first electrode and a second electrode which is grounded, the semiconductor device further includes third wiring that connects the output terminal of the semiconductor element and the first electrode of the third capacitive element through the first wiring, and the high-pass matching circuit further includes the third wiring and the third capacitive element.

14. The semiconductor device according to claim 13, wherein the active element is made of a group-III nitride semiconductor.

* * * * *